United States Patent
Nozieres et al.

(10) Patent No.: US 7,894,228 B2
(45) Date of Patent: *Feb. 22, 2011

(54) SYSTEM AND METHOD FOR PROVIDING CONTENT-ADDRESSABLE MAGNETORESISTIVE RANDOM ACCESS MEMORY CELLS

(75) Inventors: Jean-Pierre Nozieres, Le Sappey-en-Chartreuse (FR); Virgile Javerliac, Sunnyvale, CA (US)

(73) Assignee: Crocus Technology S.A., Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/422,752

(22) Filed: Apr. 13, 2009

(65) Prior Publication Data

US 2009/0213632 A1    Aug. 27, 2009

Related U.S. Application Data

(62) Division of application No. 11/869,632, filed on Oct. 9, 2007, now Pat. No. 7,518,897.

(60) Provisional application No. 60/828,438, filed on Oct. 6, 2006.

(51) Int. Cl.
    *G11C 15/02* (2006.01)
(52) U.S. Cl. .................. 365/50; 365/49.1; 365/158
(58) Field of Classification Search .............. 365/50
    See application file for complete search history.

(56) References Cited

U.S. PATENT DOCUMENTS

| | | | |
|---|---|---|---|
| 6,191,973 B1 | 2/2001 | Moyer | |
| 6,269,016 B1 | 7/2001 | Moyer | |
| 6,304,477 B1 | 10/2001 | Naji | |
| 6,317,349 B1 | 11/2001 | Wong | |
| 6,385,082 B1 | 5/2002 | Abraham et al. | |
| 6,532,164 B2 | 3/2003 | Redon et al. | |

(Continued)

FOREIGN PATENT DOCUMENTS

EP    1 225 593 A1    7/2002

(Continued)

OTHER PUBLICATIONS

Notice of Allowance and Fees Due, Jan. 2, 2009.

(Continued)

*Primary Examiner*—Tan T. Nguyen
(74) *Attorney, Agent, or Firm*—Pearne & Gordon LLP

(57) ABSTRACT

A content-addressable random access memory having magnetic tunnel junction-based memory cells and methods for making and using same. The magnetic tunnel junction has first and second magnetic layers and can act as a data store and a data sense. Within each cell, registered data is written by setting a magnetic orientation of the first magnetic layer in the magnetic tunnel junction via current pulses in one or more current lines. Input data for comparison with the registered data can be similarly set through the magnetic orientation of the second magnetic layer via the current lines. The data sense is performed by measuring cell resistance, which depends upon the relative magnetic orientation of the magnetic layers. Since data storage, data input, and data sense are integrated into one cell, the memory combines higher densities with non-volatility. The memory can support high speed, reduced power consumption, and data masking.

16 Claims, 12 Drawing Sheets

U.S. PATENT DOCUMENTS

| | | | |
|---|---|---|---|
| 6,535,416 B1 | 3/2003 | Daughton et al. | |
| 6,603,677 B2 | 8/2003 | Redon et al. | |
| 6,693,822 B2 | 2/2004 | Ito | |
| 6,724,674 B2 * | 4/2004 | Abraham et al. | 365/211 |
| 6,950,335 B2 | 9/2005 | Dieny et al. | |
| 6,954,375 B2 | 10/2005 | Ohmori | |
| 6,963,098 B2 | 11/2005 | Daughton et al. | |
| 7,012,832 B1 | 3/2006 | Sin et al. | |
| 7,129,555 B2 | 10/2006 | Nozieres et al. | |
| 7,310,265 B2 * | 12/2007 | Zheng et al. | 365/158 |
| 7,518,897 B2 * | 4/2009 | Nozieres et al. | 365/50 |
| 2002/0057593 A1 | 5/2002 | Hidaka | |
| 2003/0012063 A1 | 1/2003 | Chien | |
| 2004/0095801 A1 | 5/2004 | Stipe | |
| 2004/0160809 A1 | 8/2004 | Lin et al. | |
| 2005/0195658 A1 | 9/2005 | Sousa et al. | |
| 2006/0291276 A1 | 12/2006 | Nozieres et al. | |

FOREIGN PATENT DOCUMENTS

| | | |
|---|---|---|
| EP | 1 321 943 A | 6/2003 |
| EP | 1 507 266 A | 2/2005 |
| EP | 1 580 748 A | 9/2005 |
| EP | 2 109 111 A1 | 10/2009 |
| FR | 2 817 998 A1 | 6/2002 |
| FR | 2 817 999 A1 | 6/2002 |
| FR | 2 829 867 A1 | 3/2003 |
| FR | 2 829 868 A1 | 3/2003 |
| FR | 2 832 542 A1 | 5/2003 |
| WO | WO 03/025942 A2 | 3/2003 |
| WO | WO 03/025946 A1 | 3/2003 |
| WO | WO 03/043017 A2 | 5/2003 |
| WO | WO 2005/036559 A1 | 4/2005 |
| WO | WO 2005/086171 A1 | 9/2005 |
| WO | WO 2008/010957 A2 | 1/2008 |
| WO | WO 2008/040561 A3 | 4/2008 |

OTHER PUBLICATIONS

International Search Report, PCT/EP07/008702, Apr. 10, 2008.
Notice of Allowance, U.S. Appl. No. 12/348,830, filed Oct. 19, 2009.
EP Examination Report, Application No. 07 818 777.0-2210, Aug. 4, 2009.
Purnama, Budi, et al., "Micromagnetic Simulation of Thermally Assisted Magnetization Reversal in Magnetic Nanodots with Perpendicular Anisotropy," Journal of Magnetism and Magnetic Materials, 310 (2007) pp. 2683-2685.

* cited by examiner

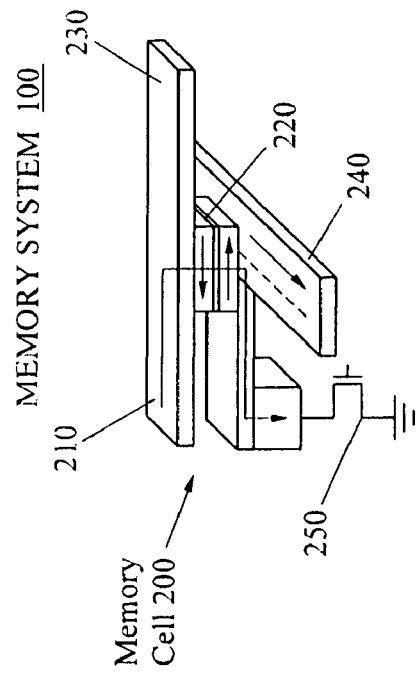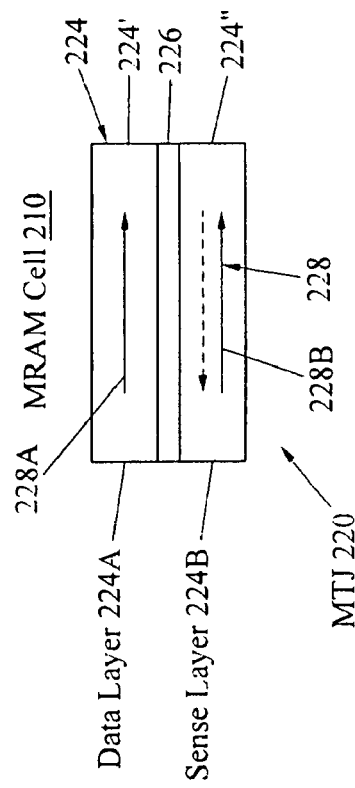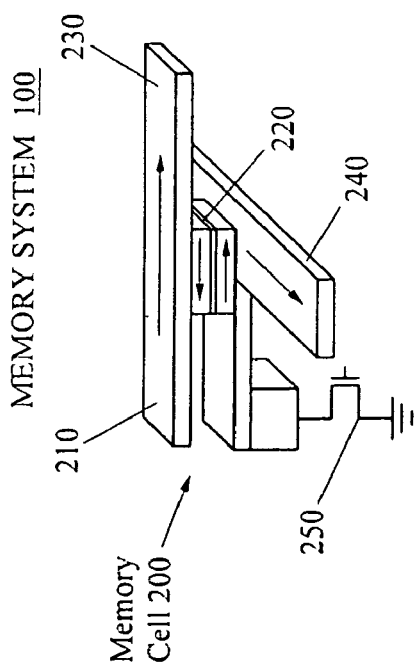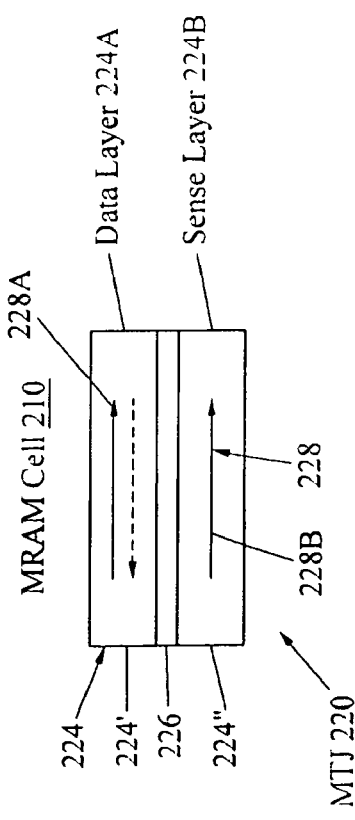

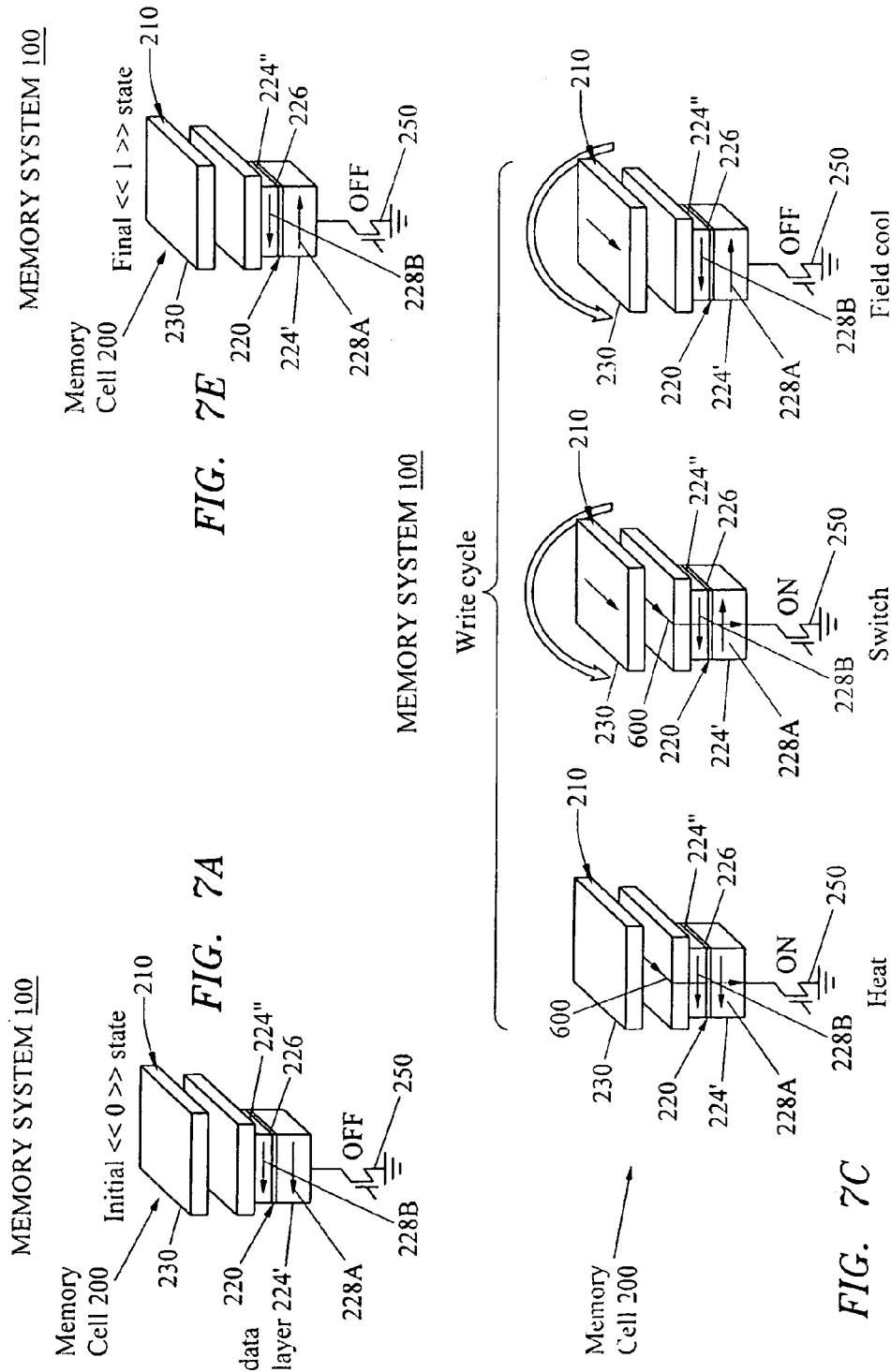

SYSTEM AND METHOD FOR PROVIDING CONTENT-ADDRESSABLE MAGNETORESISTIVE RANDOM ACCESS MEMORY CELLS

CROSS-REFERENCE TO RELATED APPLICATIONS

This application is a divisional application of co-pending application Ser. No. 11/869,632, filed on Oct. 9, 2007, now U.S. Pat. No. 7,518,897 which claims the benefit of U.S. Provisional Ser. No. 60/828,438, filed on Oct. 6, 2006. Priority to each of the prior applications is expressly claimed, and the disclosures of the applications are hereby incorporated herein by reference in their entireties.

FIELD

The present disclosure relates generally to random access memory and more particularly, but not exclusively, to content-addressable random access memory having magnetic tunnel junction-based memory cells.

BACKGROUND

Most memory devices store and retrieve data by addressing specific memory locations. Addressing specific memory locations, however, often becomes the limiting factor for systems that rely on fast memory access. The time required to find an item stored in memory can be reduced considerably if the stored data item can be identified for access by the content of the data itself rather than by its address. Memory that is accessed in this manner is called content-addressable memory (CAM).

Unlike standard random access memory (RAM) in which the user supplies a memory address and the RAM returns the data word stored at that address, a CAM is designed such that the user supplies a data word and the CAM searches its entire memory in one-clock cycle to see if that data word is stored anywhere in it. If the data word is found, the CAM returns a list of one or more storage addresses where the word was found. The CAM can be preloaded at device start-up and rewritten during device operation.

Because a CAM is designed to search its entire memory in a single operation, it is much faster than RAM in virtually all search applications. CAM is therefore ideally suited for functions, such as Ethernet address lookup, data compression, pattern-recognition, cache tags, high-bandwidth address filtering, and fast lookup of routing, high-bandwidth address filtering, user privilege, security, or encryption information on a packet-by-packet basis for high-performance data switches, firewalls, bridges, and routers.

A typical implementation of a static random access memory (SRAM) CAM cell combines six transistors with additional circuitry (e.g. transistors) to perform the one-digit comparison between the memory input and the given cell data. The additional circuitry involves at least three to four additional transistors, hence a very large cell size of eight to ten transistors, hence a costly device. A schematic of a conventional state-of-the-art SRAM-based CAM cell is depicted in FIG. 1. The CAM cell of FIG. 1 is provided as a standard SRAM cell with four or more transistors designed to implement the exclusive-OR (EOR) function.

Unlike a RAM chip, which has simple storage cells, each individual memory bit in a fully parallel CAM has its own associated comparison circuit to detect a match between the stored data bit and the input data bit. CAM chips are thus considerably smaller in storage capacity than regular memory chips. Additionally, match outputs from each cell in the data word can be combined to yield a complete data word match signal. The associated additional circuitry further increases the physical size of the CAM chip. Furthermore, CAM as it is done today (using SRAM elements) is intrinsically volatile, meaning that the data are lost when the power is turned off. As a result, every comparison circuit needs being active on every clock cycle, resulting in large power dissipation. With a large price tag, high power and intrinsic volatility, CAM is only used in specialized applications where searching speed cannot be accomplished using a less costly method.

Attempts to improve standard SRAM-based CAM have been proposed using magnetic storage cells (MRAM). U.S. Pat. No. 6,304,477, for example, discloses a standard multiple transistor SRAM-like CAM to which two magnetic tunnel junctions have been attached. The magnetic tunnel junctions provide non-volatility of the stored data, which is critical both for storing the data as well as for using masking modes architectures.

In another approach set forth in U.S. Pat. No. 6,191,973, a CAM architecture has been proposed using only magnetic (MRAM) cells. In this case, the cell element is a pair of magnetic tunnel junctions (MTJ) in opposite polarity with the input driving one of the gates of the underlying (for each cell) selection transistor. The disclosed scheme provides a significant improvement in density, wherein each CAM cell is formed from only two selection transistors and two magnetic tunnel junctions (2T/2J).

In view of the foregoing, a need exists for improved MRAM storage cells that overcome the aforementioned obstacles and deficiencies of conventional memory storage systems.

BRIEF DESCRIPTION OF THE DRAWINGS

FIG. 5A is a detail drawing illustrating an exemplary write operation for the MRAM cell of FIG. 3.

FIG. 5B is a detail drawing illustrating the operation of the magnetic tunnel junction of the MRAM cell during the write operation of FIG. 5A.

FIG. 6A is a detail drawing illustrating an exemplary read operation for the MRAM cell of FIG. 3.

FIG. 6B is a detail drawing illustrating the operation of the magnetic tunnel junction of the MRAM cell during the read operation of FIG. 6A.

FIGS. 7A-F are detail drawings illustrating an alternative exemplary write operation for the MRAM cell of FIG. 3, wherein the alternative write operation includes thermally-assisted switching (TAS).

Figure 1:
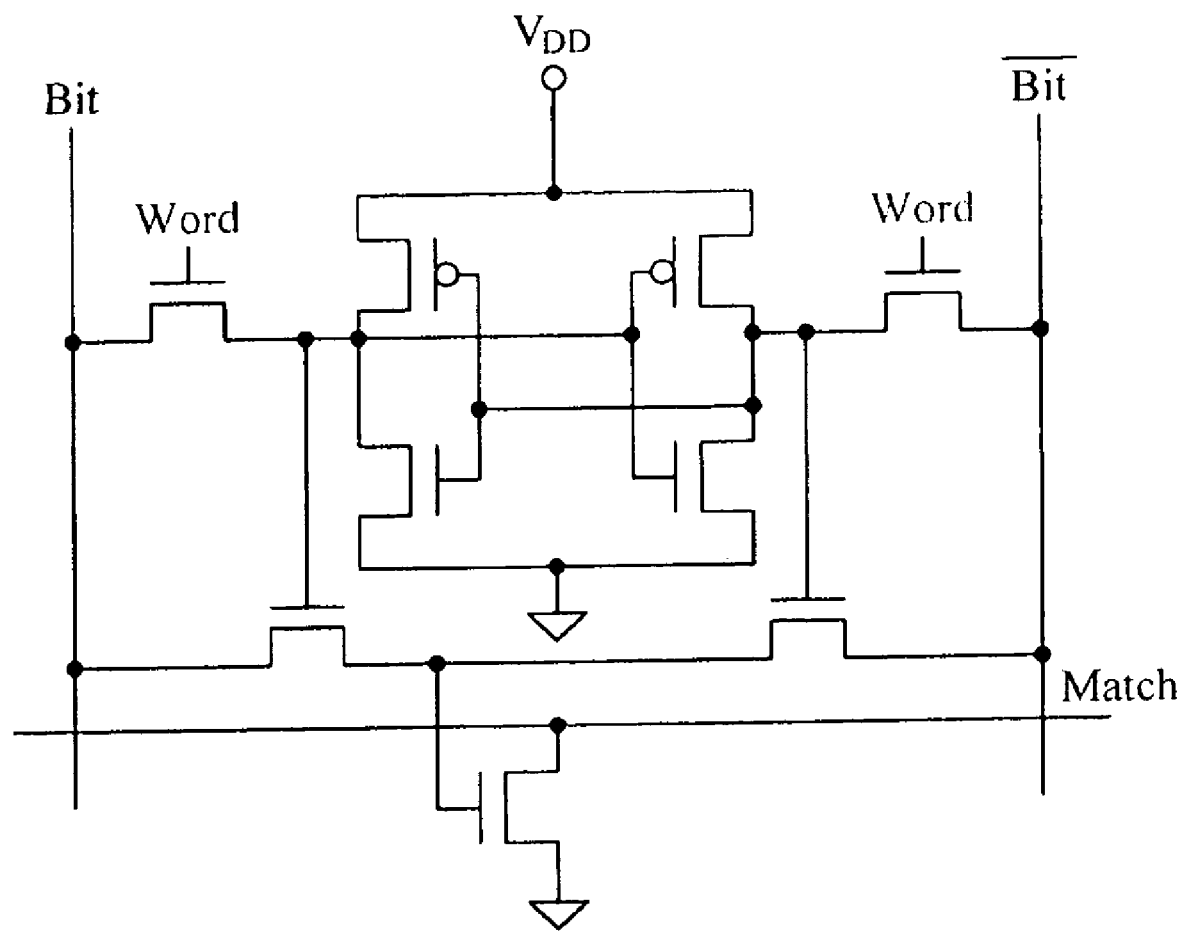
FIG. 1 illustrates a typical prior art content-addressable memory (CAM) cell, wherein the CAM cell is provided as a standard static random access memory (SRAM) cell with four or more transistors designed to implement the exclusive-OR function.

It should be noted that the figures are not drawn to scale and that elements of similar structures or functions are generally represented by like reference numerals for illustrative purposes throughout the figures. It also should be noted that the figures are only intended to facilitate the description of the preferred embodiments of the present disclosure. The figures do not illustrate every aspect of the present disclosure and do not limit the scope of the disclosure.

DETAILED DESCRIPTION OF THE PREFERRED EMBODIMENTS

Since currently-available memory systems are expensive, intrinsically volatile, and dissipate significant power, a memory system that combines higher densities with non-volatility and reduced power consumption in a cost-effective manner can prove desirable and provide a basis for a wide range of data applications. This result can be achieved, according to one embodiment disclosed herein, by memory system 100 comprising at least one random access memory cell 200 as illustrated in FIG. 2.

Figure 2:
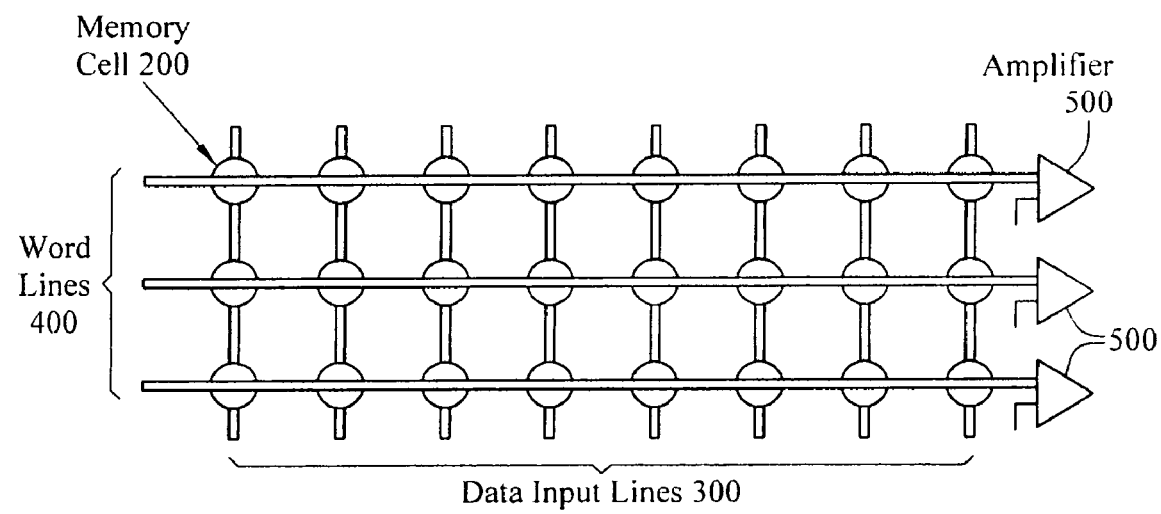
FIG. 2 is a detail drawing illustrating an embodiment of a memory system with at least one random access memory cell.

Turning to FIG. 2, the memory system 100 is illustrated as having a plurality of memory cells 200 that have been arranged into a plurality of rows and columns. Each column of the memory cells 200 is associated with a predetermined data input line 300 for providing received input data bits to selected memory cells 200; whereas, each row of the memory cells 200 is associated with a predetermined word select line 400 for providing stored data bits read from selected memory cells 200. The data input lines 300 are provided in a parallel arrangement and preferably are perpendicular to the parallel arrangement of word lines 400 as shown in FIG. 2. The word lines 400 likewise are coupled with a plurality of end-of-line amplifiers 500. Thereby, a current value of the stored data bits read from the selected memory cells 200 can be measured adjacent to an end region of the word lines 400 and sensed via the end-of-line amplifiers 500. The end-of-line amplifiers 500 enable the memory system 100 to provide one-state full-word readout and/or comparison.

Figure 3:
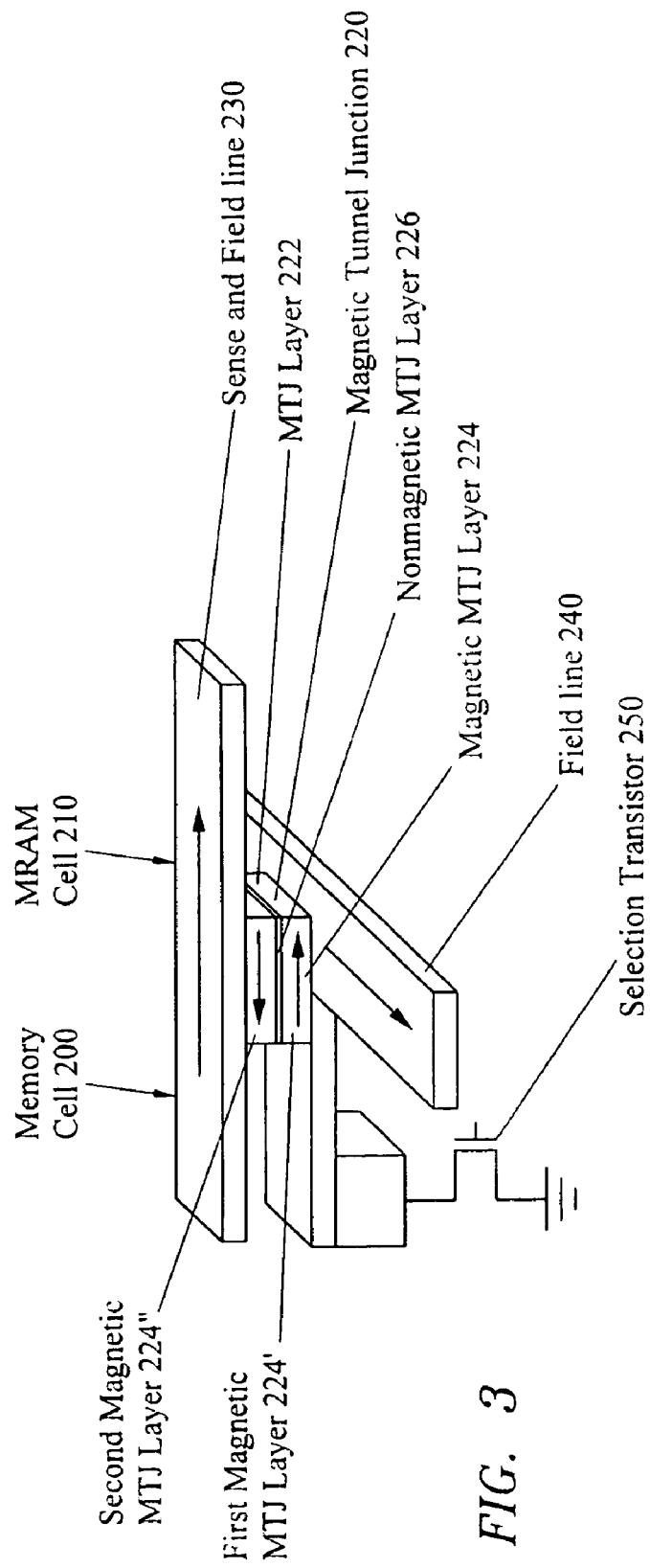
FIG. 3 is a detail drawing illustrating an embodiment of the memory cell of FIG. 2, wherein the memory cell comprises a magnetic random access memory (MRAM) cell.

The memory cell 200 is shown in FIG. 3 as being a magnetic random access memory (MRAM) cell 210. Preferably, the MRAM cell 210 is provided as a MRAM-based content-addressable memory (CAM) cell. The MRAM cell 210 thereby can store data and can be sensed, preferably simultaneously. For example, the memory system 100 can store data in the MRAM cell 210 as registered data with an address that can be subsequently searched; while, the memory system 100 also senses the MRAM cell 210 by comparing input data with the registered data stored in the MRAM cell 210.

Figure 4A:
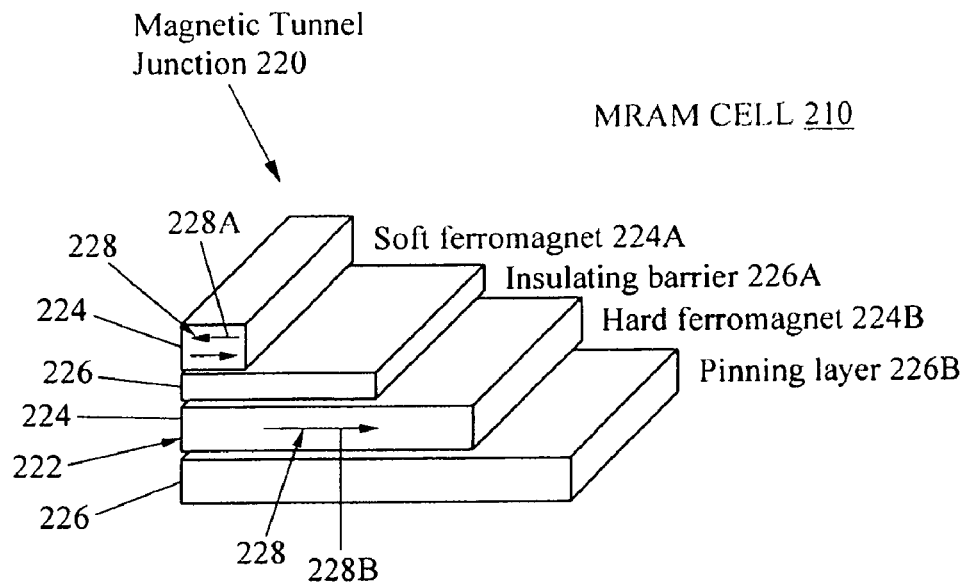
FIG. 4A is a detail drawing illustrating an embodiment of a magnetic tunnel junction of the MRAM cell of FIG. 3.

Advantageously, the MRAM cell 210 can be provided with a magnetic tunnel junction (MTJ) 220. The magnetic tunnel junction 220 is shown in FIG. 3 as being a multilayered structure, comprising a plurality of MTJ layers 222. Exemplary MTJ layers 222 of the magnetic tunnel junction 220 can include one or more magnetic MTJ layers 224 and nonmagnetic MTJ layers 226, such as an insulating layer 226A (shown in FIG. 4A). In a preferred embodiment, one of the magnetic MTJ layers 224A, 224B of the magnetic tunnel junction 220 has a magnetization 228 with a fixed magnetization direction; whereas, the magnetization 228 of another of the magnetic MTJ layers 224A, 224B has an adjustable magnetic orientation. As shown in FIG. 4A, for example, the hard ferromagnetic layer 224B is illustrated as being magnetized in a fixed direction 228B. The magnetization direction 228B of the hard ferromagnetic layer 224B can be fixed in any conventional manner, such as by using a high coercivity (or large switching magnetic field) material or by coupling the ferromagnetic layer to an antiferromagnetic material.

To form the MRAM cell 210, the magnetic tunnel junction 220 is coupled with at least one current line, such as a sense and field line 230, as well as with a selection transistor 250. FIG. 3 illustrates a typical configuration of the MRAM cell 210. As shown in FIG. 3, the sense and field line 230 preferably is disposed orthogonally to the field line 240, and the magnetic tunnel junction 220 is disposed between the sense and field line 230 and the field line 240. During write operations, the sense and field line 230 and the field line 240 act as magnetic field providers to write incoming data to the MRAM cell 210. Similarly, contents stored in the MRAM cell 210 can be accessed via the selection transistor 250 and the sense and field line 230, which serves as a sense line, during read operations.

The magnetic MTJ layers 222 typically are formed from a conventional ferromagnetic material, such as iron, cobalt nickel and their alloys, and are separated by an insulating layer (or barrier) 226A. The insulating layer 226A preferably is provided as a thin insulating layer and can be formed from any suitable insulating material, such as alumina or magnesium oxide. As desired, the magnetic tunnel junction 220 can comprise any suitable number and/or arrangement of the MTJ layers 222, including one or more MTJ layers 222 of other types and/or compositions, as well as a pinning layer 226B as illustrated in FIG. 4A. Typical antiferromagnetic materials include IrMn, PtMn or NiMn.

By fixing the magnetization direction, the hard ferromagnetic layer 224B can serve as the reference layer 224" (shown in FIG. 3) for the MRAM cell 210.

The soft ferromagnetic layer 224A likewise is shown as having a magnetization 228. Preferably being formed from a low coercivity (or small switching magnetic field) material, the magnetization 228 of the soft ferromagnetic layer 224A has an adjustable magnetic orientation 228A and can be switched from a first stable direction to a second stable direction in any conventional manner. The soft ferromagnetic layer 224A thereby can serve as the storage layer 224' (shown in FIG. 3) for the MRAM cell 210. Although the soft ferromagnetic layer 224A and the hard ferromagnetic layer 224B are shown and described as being the storage layer 224' and the reference layer 224", respectively, for the MRAM cell 210 for purposes of illustration, the soft ferromagnetic layer 224A likewise can be configured to serve as the reference layer 224", and the hard ferromagnetic layer 224B can serve as the storage layer 224'.

Different levels of cell resistance for the MRAM cell 210 are associated with the relative magnetic orientations of the storage layer 224' and the reference layer 224". Stated somewhat differently, the magnetic tunnel junction 220 can have a first cell resistance when the magnetic orientations of the storage and reference layers 224', 224" of the MRAM cell 210 are in opposing directions (or are "antiparallel"); whereas, the magnetic tunnel junction 220 can have a second cell resistance when the magnetic orientation of the reference layer 224" of the MRAM cell 210 is in the same direction as, or is "parallel" to, the magnetic orientation of the storage layer 224'.

Figure 4B:
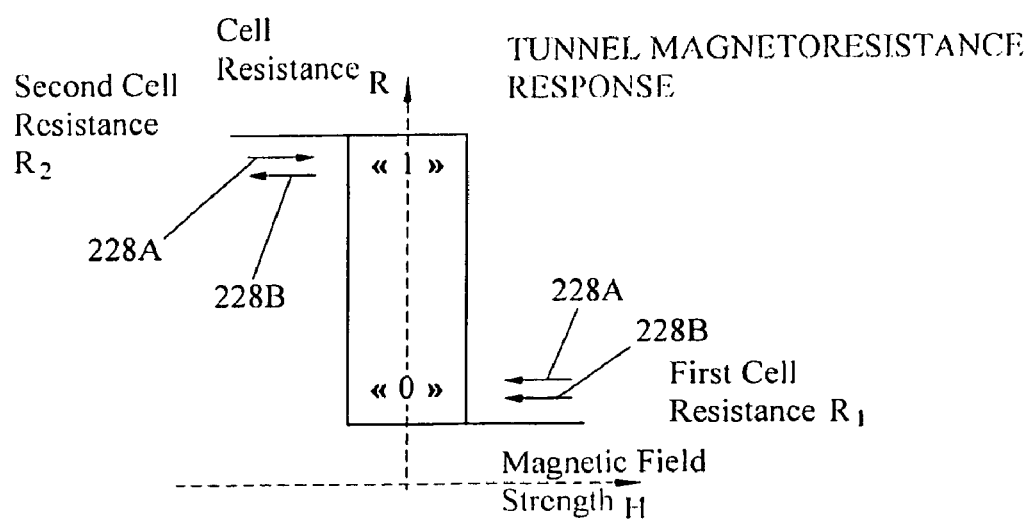
FIG. 4B is a characteristic diagram illustrating an exemplary tunnel magnetoresistance response of the magnetic tunnel junction of FIG. 4A.

A characteristic diagram illustrating an exemplary tunnel magnetoresistance response of the magnetic tunnel junction 220 is shown in FIG. 4B. The characteristic diagram represents the tunnel magnetoresistance response as cell resistance R as a function of magnetic field strength H. As illustrated by the characteristic diagram of FIG. 4B, the cell resistance R for the MRAM cell 210 has a first cell resistance value $R_1$ when the magnetic orientation 228A of the soft ferromagnetic layer 224A and the magnetization direction 228B of the hard ferromagnetic layer 224B have the same direction (or are "parallel"). The cell resistance R for the MRAM cell 210 likewise can have a second cell resistance value $R_2$, greater than the first cell resistance value $R_1$, when the magnetic orientation 228A of the soft ferromagnetic layer 224A and the magnetization direction 228B of the hard ferromagnetic layer 224B have the different directions (or are "antiparallel").

The difference in resistance between the first cell resistance value $R_1$ and the second cell resistance value $R_2$ is known as "magnetoresistance" or "tunnel magnetoresistance" (TMR) and can vary based, for example, upon the characteristics, such as a thickness and composition, of the insulating material forming the insulating layer 226A (shown in FIG. 4A). The difference in resistance between the first and second cell resistance values $R_1$, $R_2$ can be on the order of between approximately fifty and seventy percent for alumina-based magnetic tunnel junctions 220 and can exceed two hundred percent for magnesium oxide-based magnetic tunnel junctions 220.

Turning to FIGS. 5A-B, operation of the MRAM cell 210 is discussed with reference to a write operation. In the manner discussed in more detail above with reference to FIG. 4A, the MRAM cell 210 can be provided with a multilayered magnetic tunnel junction (MTJ) 220, which includes at least two magnetic MTJ layers 224, such as the storage layer (or data layer) 224A and the reference layer (or sense layer) 224B, with at least one intermediate nonmagnetic MTJ layer 226. The reference layer 224B can be formed from a high coercivity material and is magnetized in a fixed direction 228B; whereas, the magnetization 228 of the storage layer 224A has an adjustable magnetic orientation 228A. The magnetic orientation 228A of the storage layer 224A thereby can be switched from a first stable direction to a second stable direction, as desired, via application of an externally-applied magnetic field and/or a (spin polarized) write current in the manner set forth above. As desired, the MRAM cell 210 can provided as a content-addressable memory (CAM) MRAM cell.

During a write operation, a data bit with a predetermined logic state, such as a high (or "1") logic state or a low (or "0") logic state, is provided to the MRAM cell 210 via at least one current line, such as the sense and field line 230 and/or the field line 240. The MRAM cell 210 receives the data bit, and the data bit is written to the MRAM cell 210 by adjusting the magnetization 228 of the storage layer (or data layer) 224A to a selected magnetic orientation 228A. Preferably, the magnetic orientation 228A of the storage layer 224A is aligned though the magnetic field generated by the current lines 230, 240 as discussed above. The polarity of the current flowing through the current lines 230, 240 determines the magnetic orientation 228A of the storage layer 224A and, therefore, the logic state of the MRAM cell 210. In an alternative embodiment, the magnetic orientation 228A of the storage layer 224A is aligned by a (spin polarized) write current flowing through the MRAM cell 210 via the selection transistor 250, or by a combination of both a magnetic field and a write current. The magnetization 228 of the MRAM cell 210 thereby is aligned to correspond with the predetermined logic state associated with the received data bit. The MRAM cells 210 forming the memory system 100 can be rewritten, in whole and/or in part, at any time. As desired, write operations can include spin transfer induced effects, wherein current flowing throughout a magnetic tunnel junction 220 can directly switch the magnetization direction 228B of the reference layer 224B (or sense layer) 224B.

Operation of the MRAM cell 210 during an exemplary read operation is illustrated in FIGS. 6A-B. A data bit with a predetermined logic state previously written to, and stored by, the MRAM cell 210. When the read operation is initiated, the memory system 100 senses the cell resistance R (shown in FIG. 4B) of the MRAM cell 210, which is associated with the magnetic orientation 228A of the storage layer 224A relative to the fixed magnetic orientation 228B of the reference layer 224B in the manner disclosed above with reference to FIGS. 4A-B. Thereby, the sensed cell resistance value can be used to determine the logic state of the stored data bit stored by the MRAM cell 210. The cell resistance R can be sensed in any conventional manner. For example, an electrical current can be applied to the magnetic tunnel junction 220 via the selection transistor 250 to sense the cell resistance R.

If the MRAM cell 210 is provided as a content-addressable memory (CAM) MRAM cell, for example, a data bit with a selected logic state can be inputted to the MRAM cell 210 for comparison with the stored data bit stored by the MRAM cell 210. The MRAM cell 210 receives the inputted data bit via at least one current line, such as the sense and field line 230 as shown in FIG. 6A. The current flowing through the sense and field line 230 induces a magnetic field, which aligns the magnetization 228 of the reference layer 224B. Stated somewhat differently, the polarity of the current flowing through the sense and field line 230 induces the magnetization 228 of the reference layer 224B to be aligned with a predetermined magnetic orientation 228B.

The magnetic orientation 228B of the reference layer 224B as induced by the inputted data bit then is compared with the magnetic orientation 228A of the storage layer 224A associated with the stored data bit. The relative alignment of the storage layer 224A and the reference layer 224B thereby can be measured. If the magnetic orientation 228B of the reference layer 224B and the magnetic orientation 228A of the storage layer 224A have the same direction (or are "parallel"), the inputted data bit matches the stored data bit. The inputted data bit and the stored data bit are not a match, however, if the magnetic orientation 228B of the reference layer 224B and the magnetic orientation 228A of the storage layer 224A are in opposing directions (or are "antiparallel"). The MRAM cell 210 therefore can support data mask operations, wherein data addresses are not associated with data during read operations. As desired, parallel storage and reference layers 224A, 224B can be indicative of matching inputted and stored data bits; whereas, unmatched inputted and stored data bits can be associated with storage and reference layers 224A, 224B with antiparallel magnetic orientations 228A, 228B.

The MRAM cell 210 thereby can advantageously operate as a built-in exclusive-NOR (XNOR) circuit, enabling the MRAM cell 210 to determine by itself the matching between the stored data bits and the inputted data bits. Stated somewhat differently, the MRAM cell 210 provides the advantage of integrating data storage, data input, and data sense functionalities into a single memory cell without requiring any additional cell elements. The MRAM cell 210 further provides the data storage, data input, and data sense functionalities without requiring any additional cell elements and in combination with intrinsic non-volatility and high-density (or small dimension), such as via one selection transistor and one magnetic tunnel junction (1T/1J) MRAM cells and/or two selection transistor and two magnetic tunnel junction (2T/2J) MRAM cells. Providing complete scalability down to small technology nodes, the MRAM cell 210 can be easy and cost efficient, particularly with reference to requiring minimum real estate on an integrated circuit substrate, to imbed in a memory system 100. The MRAM cell 210 likewise can combine these advantages with low power consumption and high-speed operation, particularly in a "dynamic mode."

FIGS. 7A-F illustrate the operation of the MRAM cell 210 during an alternative write operation, wherein the write operation includes thermally-assisted switching (TAS). Here, the write operation is performed by combining the actions of providing a magnetic field to the MRAM cell 210 via one or more of the current lines, such as the sense and field line 230 and/or the field line 240, as set forth above with injecting a current through the magnetic tunnel junction 220 to induce heat within the MRAM cell 210. The storage layer 224A preferably is formed as a ferromagnetic/antiferromagnetic bilayer. Exemplary materials for forming the ferromagnetic/antiferromagnetic bilayer can include FeCo/PtMn and/or FeCo/IrMn. The MRAM cell 210 thereby can provide the advantages of combining high density and scalability with facilitated read operations.

Figure 7B:
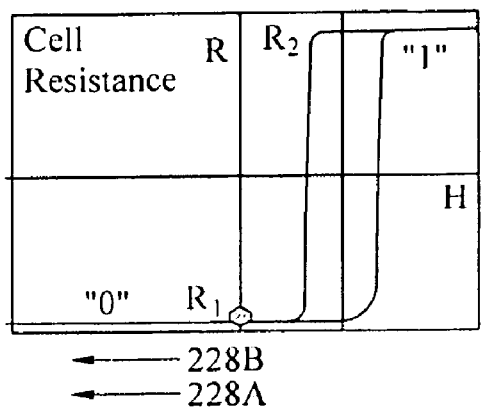

The initial state of the MRAM cell 210 prior to the write operation is shown in FIGS. 7A-B. The sense and field line 230 is shown as being the single current line for writing the input data bit to the MRAM cell 210, and the selection transistor 250 is illustrated as being deactivated, opening the source-drain path through the selection transistor 250. In the initial state, the MRAM cell 210 of FIGS. 7A-B has a stored data bit with a low (or "0") logic state. Further, since the stored data bit with a low logic state, the magnetic orientation 228A of the storage layer 224A and the magnetic orientation 228B of the reference layer 224B are shown as having the same direction (or are "parallel"). The cell resistance R of the magnetic tunnel junction 220 therefore is the low cell resistance value $R_1$ in the manner discussed in more detail above with reference to FIG. 4B.

Figure 7D:
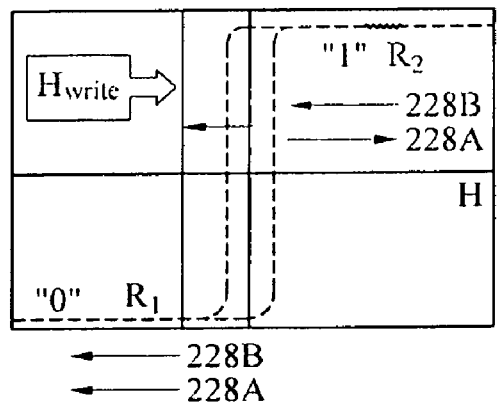

Once the write operation has been initiated, the selection transistor 250 is activated to form a source-drain path through the selection transistor 250, and a current pulse 610 is sent to the MRAM cell 210 via the sense line 230 as illustrated in FIGS. 7C-D. The current pulse 610 is associated with a write operation, whereby an input data bit with a high (or "1") logic state is to be written to the MRAM cell 210. The current pulse 610 reaches the MRAM cell 210 and, since the selection transistor 250 is activated, travels through the source-drain path of the selection transistor 250 as well as through the magnetic tunnel junction 220. The magnetic tunnel junction 220 therefore begins to heat.

As the magnetic tunnel junction 220 heats, a current pulse 610 flowing through the field line 210 likewise induces a magnetic field, which aligns the magnetization 228 of the reference layer 224B. The magnetic orientation 228A of the storage layer 224A thereby can be switched from a first stable direction to a second stable direction via application of the magnetic field in the manner set forth in more detail above. Upon application of the magnetic field from the field line 210, the magnetic orientation 228A of the storage layer 224A begins to reverse as shown in FIGS. 7C-D to become aligned in opposing directions (or to become "antiparallel") to the magnetic orientation 228B of the reference layer 224B.

When the temperature of the magnetic tunnel junction 220 reaches a predetermined temperature threshold (or "blocking temperature"), the selection transistor 250 is deactivated, opening the source-drain path such that the current pulse 610 no longer travels through the magnetic tunnel junction 220. The magnetic tunnel junction 220 therefore begins to cool. The magnetic field from the field line 230 continues to be applied to the storage layer 224A as the magnetic tunnel junction 220 cools and is maintained until the temperature of the magnetic tunnel junction 220 cools to a predetermined low temperature threshold. The magnetization 228 of the storage layer 224A thereby is "frozen" in the new magnetic orientation 228A as induced by the magnetic field produced by the current pulse 610 traveling through the field line 230.

Figure 7F:
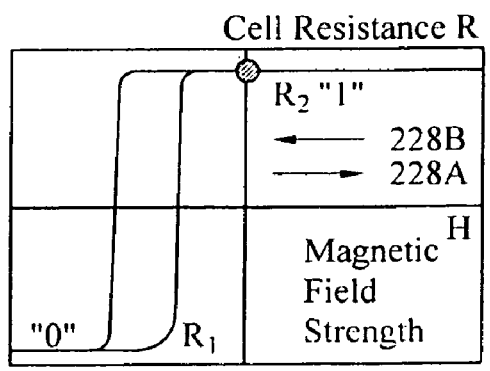

The final state of the MRAM cell 210 after the write operation is illustrated in FIGS. 7E-F. As shown in FIG. 7E, the input data bit with the high logic state has been written to the MRAM cell 210 and has become the new stored data bit. The selection transistor 250 remains deactivated with an open source-drain path, and the input data bit with the high logic state has been written to the MRAM cell 210. Stated somewhat differently, the MRAM cell 210 has a stored data bit with a high logic state. Further, the new magnetic orientation 228A of the storage layer 224A and the magnetic orientation 228B of the reference layer 224B are shown as being aligned in opposing directions (or as being "antiparallel"). The cell resistance R of the magnetic tunnel junction 220 therefore has become the high cell resistance value $R_2$ in the manner discussed in more detail above with reference to FIG. 4B. Additional details regarding write operations with thermally-assisted switching (TAS) can be found in U.S. Pat. No. 6,950,335, the disclosure of which is hereby incorporated herein by reference in its entirety.

Use of thermally-assisted switching during write operations can help improve the overall performance of the MRAM cell 210, particularly at small feature sizes and/or high densities. A single current line 230, 240 likewise can be used to write the input data bit to the MRAM cell 210, and the cost to manufacture the MRAM cell 210 can be reduced. In addition, the material types and geometries used to produce the MRAM cell 210 can be optimized to reduce power consumption of the MRAM cell 210 by minimizing the reference layer 224B.

In an alternative approach, the MRAM cell 210 is written not by an external magnetic field (with or without thermal assist), but by a spin polarized electric current (Current Induced Magnetic Switching—CIMS). As experimentally demonstrated in entirely metallic low sized (<100 nm) structures in the publication, Science, volume 285, page 867 (1999), and, in U.S. Pat. No. 5,695,864, a spin polarized current is able to induce a precession or even a switching (reversing) of the magnetization by a transfer process of the angular spin moment between polarized carriers and the magnetic moment of the system. Such architecture is highly scalable as the required current scales with the area of the cell. Furthermore it is potentially very fast and does not require metal lines to generate magnetic field, hence reducing both the cell size and the drivers overhead.

CIMS writing can be advantageously combined with TAS as described in the general case of a MRAM memory in U.S. Pat. No. 6,950,335. In this case, the MRAM cell 210 is written as described in FIGS. 7A-F, with the difference that there is no magnetic field generated by the field line 230. Instead, the heating current 600 itself is used to witch the magnetic orientation 228A of the storage layer 224A by being appropriately spin polarized whilst flowing through the magnetic tunnel junction 210. This is done by adding specific layers in the junction 210, as can be described in U.S. Pat. No. 6,603,677.

The combined use of TAS and CIMS to write the data layer allows for a reduction in write power, particularly at small feature sizes. The readout would remain the same as in the magnetic field-driven CAM architecture.

Figure 8A:
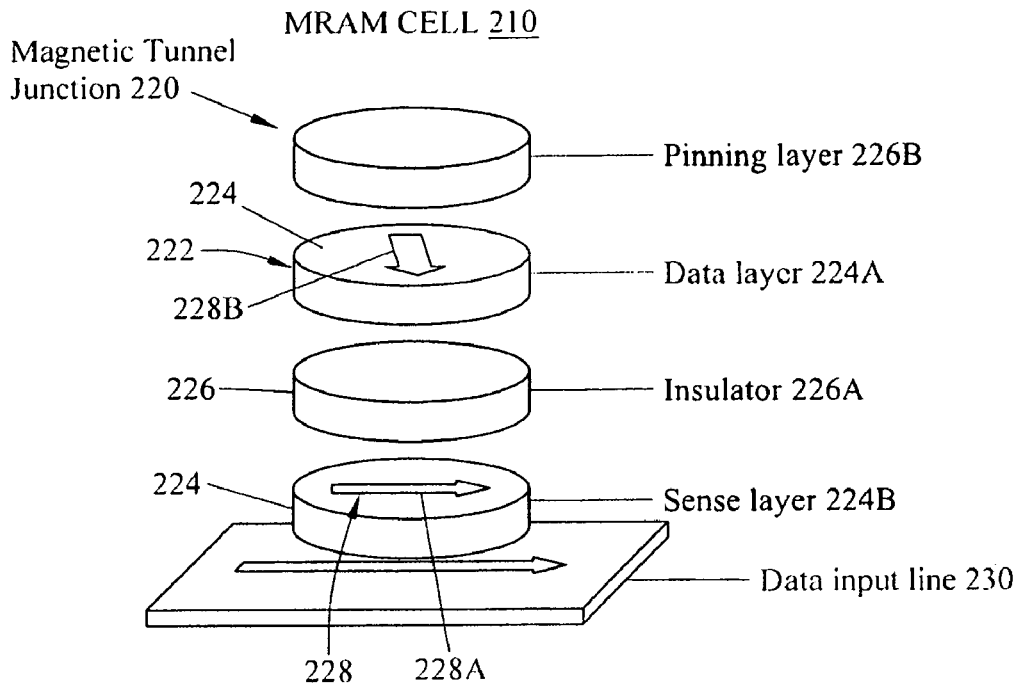
FIG. 8A is a detail drawing illustrating an alternative embodiment of the magnetic tunnel junction of FIGS. 4A-B, wherein the magnetic tunnel junction has a pair of magnetic layers with magnetizations polarized in perpendicular magnetic orientations.

Input data can be written to, and stored data can be read from, the MRAM cell 210 in the manner discussed in more detail above with reference to FIGS. 5A-B and 6A-B, respectively, including via the write operation with thermally-assisted switching (TAS) of FIGS. 7A-F. As for a content-addressable memory (CAM) operation, as illustrated in FIG. 8A, an input data bit can be received via the data input line 230, inducing a magnetic field. The induced magnetic field of the data input line 230 is generated in a direction that is perpendicular to the long dimension of the elongated MRAM cell 210. The reference layer 224B therefore can be disposed with the magnetization direction 228B that is in the same direction as (or "parallel" with), or in a direction opposing (or "antiparallel" with), the magnetization direction 228A of the storage layer 224A, depending upon the magnetic polarity of the induced magnetic field of the data input line 230.

Figure 8B:
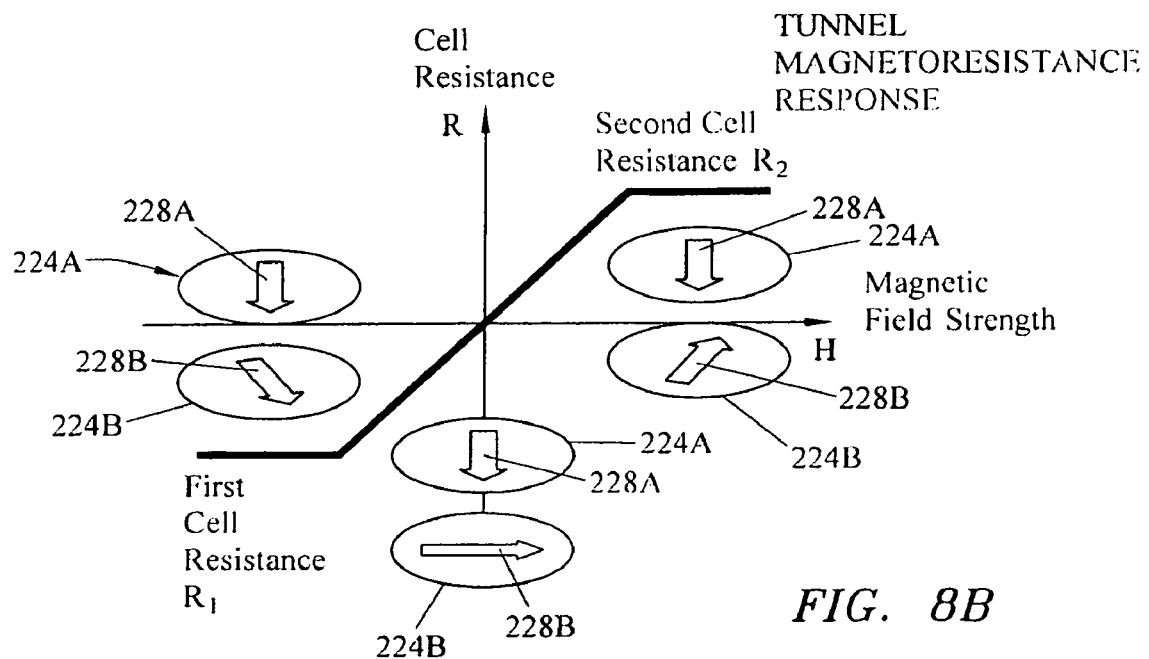
FIG. 8B is a characteristic diagram illustrating an exemplary tunnel magnetoresistance response of the magnetic tunnel junction of FIG. 8A.

Turning to FIG. 8B, a characteristic diagram illustrating an exemplary tunnel magnetoresistance response of the magnetic tunnel junction 220 of FIG. 8A, wherein cell resistance R is represented as a function of magnetic field strength H in the manner discussed with reference to FIG. 8A. As illustrated by the characteristic diagram of FIG. 8B, the cell resistance R for the MRAM cell 210 has a first cell resistance value $R_1$ when the magnetic orientation 228A of the storage layer 224A and the magnetization direction 228B of the reference layer 224B reference layer 224B have approximately the same direction (or are "parallel"). The cell resistance R for the MRAM cell 210 likewise can have a second cell resistance value $R_2$, greater than the first cell resistance value $R_1$, when the magnetic orientation 228A of the storage layer 224A and the magnetization direction 228B of the reference layer 224B have approximately opposing directions (or are "antiparallel"). Further, the MRAM cell 210 can assume a cell resistance value R intermediate the first and second cell resistance values $R_1$, $R_2$ as the magnetization direction 228B of the reference layer 224B transitions between the parallel and antiparallel directions relative to the magnetic orientation 228A of the storage layer 224A. As illustrated in FIG. 8A, for example, the cell resistance value R of the MRAM cell 210 can decrease as the magnetization directions 228A, 228B become more parallel and can increase as the magnetization directions 228A, 228B become more antiparallel.

Advantageously, the input data bit can be compared with a stored data bit stored within the MRAM cell 210 by moving (or fluctuating) the magnetization direction 228B of the reference layer 224B via the magnetic field induced by the input data bit current flowing through the data input line 230. The input data bit and the stored data bit thereby can be compared without switching the magnetization direction 228B of the reference layer 224B. The MRAM cell 200 thereby can operate in a dynamic mode without having to switch the magnetization direction 228B of the sense layer 224B to perform a read operation. The perpendicular orientations of the magnetization directions 228A, 228B advantageously enable the MRAM cell 210 to support high-speed read operations combined with reduced power consumption. Design and manufacturing control of the MRAM cell 210 therefore can be simplified. Further, the amount of power dissipated by the MRAM cell 210 during read operations can be reduced, and the operating speed of the MRAM cell 210 can be increased, because the induced magnetic field provided by the data input line 230 fluctuates, rather than fully switches, the magnetization direction 228B of the reference layer 224B.

An alternative embodiment of the MRAM cell 210 is shown and described with reference to FIGS. 8A-B. As illustrated in FIG. 8A, the MRAM cell 210 includes a magnetic tunnel junction 220 that is provided in the manner set forth in more detail above with reference to FIGS. 3 and 4A-B. The magnetic tunnel junction 220 is shown as including at least one nonmagnetic MTJ layer 226, such as an insulating layer 226A, disposed between a pair of magnetic MTJ layers 224, such as a storage layer 224A and a reference layer 224B. Here, the storage layer 224A has a magnetization 228 with a magnetization direction 228A that is oriented at a right angle to magnetization direction 228B of the reference layer 224B. In other words, the magnetization direction 228A of the storage layer 224A and the magnetization direction 228B of the reference layer 224B are polarized in perpendicular directions. The MRAM cell 210 thereby can operate in a dynamic mode without having to switch the magnetization direction 228B of the reference layer 224B to perform a read operation. The perpendicular the magnetization directions 228A, 228B advantageously enable the MRAM cell 210 to support high-speed read operations combined with reduced power consumption.

The MRAM cell 210 of FIG. 8A can be provided in any conventional manner. For example, the MRAM cell 210 can be provided as an elongated magnetic cell and the chip (or wafer) (not shown) upon which the MRAM cell 210 is formed can be cooled in a magnetic field oriented along the short dimension of the MRAM cell 210. The storage layer 224A thereby can be provided with the magnetization 228 with the magnetization direction 228A that is frozen in the direction of the magnetic field applied to the chip (or wafer) during a heating process. During the heating process, the magnetization direction 228B of the reference layer 224B can be oriented along the long dimension of the elongated MRAM cell 210 such that the reference layer 224B is disposed in a low energy state.

Figure 9A:
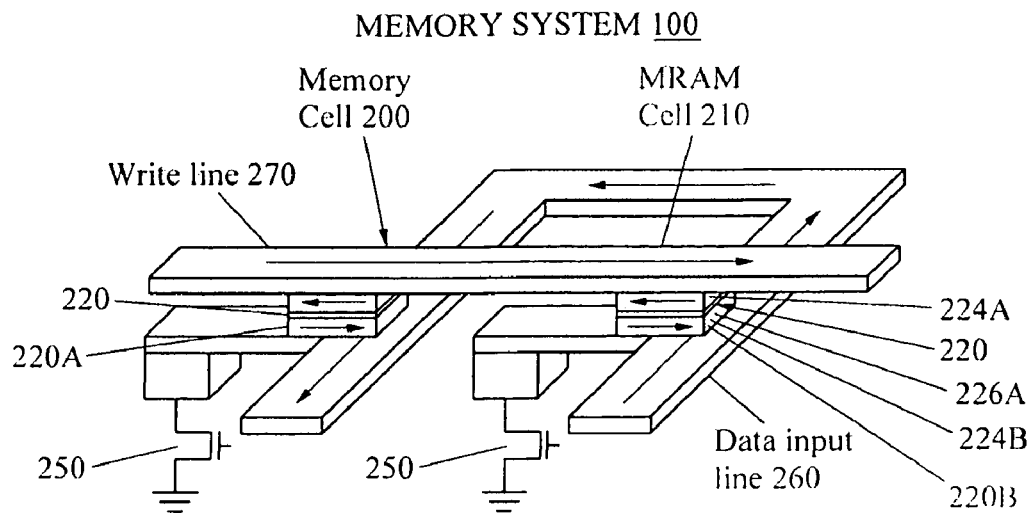
FIG. 9A is a detail drawing illustrating an alternative embodiment of the MRAM cell of FIG. 3, wherein the MRAM cell comprises a magnetic self-referenced twin MRAM cell and includes a pair of magnetic tunnel junctions.

FIG. 9A illustrates another alternative embodiment of the MRAM cell 210, wherein the MRAM cell 210 is shown as comprising a magnetic self-referenced twin MRAM cell. The MRAM cell 210 includes two magnetic tunnel junctions 220A, 220B, each being provided in the manner set forth in more detail above with reference to FIGS. 3, 4A-B, and 8A-B. Each magnetic tunnel junction 220A, 220B has at least one nonmagnetic MTJ layer 226, such as an insulating layer 226A, disposed between a pair of magnetic MTJ layers 224, such as a storage layer 224A and a reference layer 224B. As shown in FIG. 9A, the storage layer 224A of the first magnetic tunnel junction 220A and the storage layer 224A of the second magnetic tunnel junction 220B can be coupled via a first common current line, such as write line 270; whereas, a second common current line, such as data input line 260 can couple the reference layers 224B of the magnetic tunnel junctions 220A, 220B. The reference layer 224B of the each magnetic tunnel junction 220A, 220B likewise can be coupled with a respective selection transistor 250 as shown and sometimes referred to as being a two selection transistors and two magnetic tunnel junction (2T/2J) configuration.

Figure 9B:
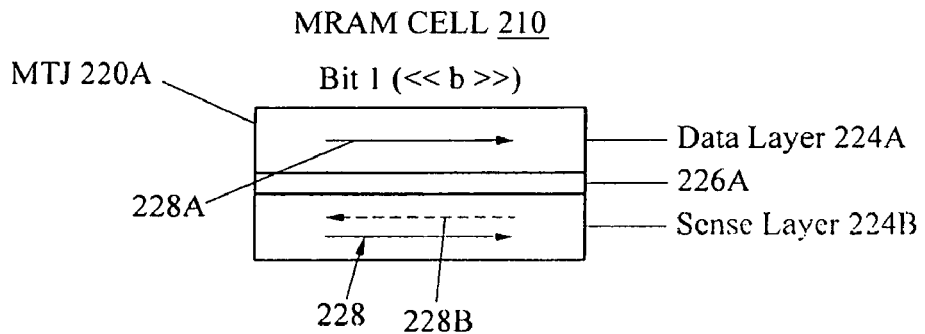
FIG. 9B is a detail drawing illustrating the operation of a first magnetic tunnel junction of the MRAM cell of FIG. 9A during an exemplary write operation.
Figure 9C:
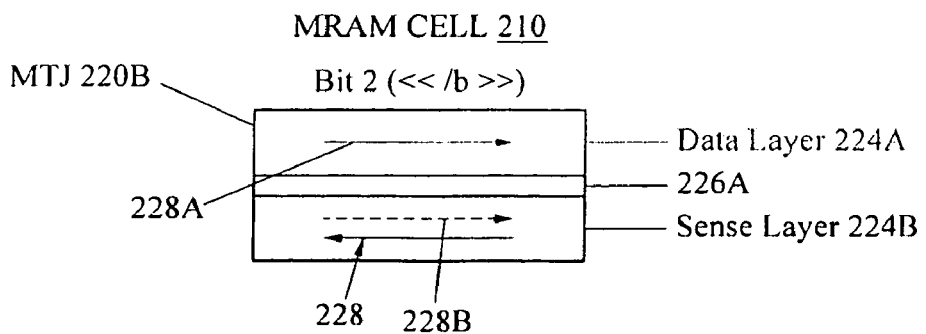
FIG. 9C is a detail drawing illustrating the operation of a second magnetic tunnel junction of the MRAM cell of FIG. 9A during an exemplary write operation.

By providing the data input line 260 with a U-shaped geometry, the MRAM cell 210 of FIG. 9A is shown with the magnetic tunnel junctions 220A, 220B being connected in series at write. During a write operation, an input data bit can be provided to the MRAM cell 210 via the data input line 260, which is induced to generate a magnetic field with a selected polarity. The MRAM cell 210 can receive an input data bit via the data input line 260 such that the input data bit can be written to each of the magnetic tunnel junctions 220A, 220B. The U-shaped geometry of the data input line 260 enables the reference layer 224B of the first magnetic tunnel junction 220A to have a magnetization direction 228B that is opposite of the magnetization direction 228B of the reference layer 224B of the second magnetic tunnel junction 220B as illustrated in FIGS. 9B and 9C. In other words, the current flowing through the data input line 260 induces the reference layers 224B of the magnetic tunnel junctions 220A, 220B to have opposite magnetization directions 228B.

The MRAM cell 210 therefore receives the input data bit with a predetermined logic state, such as a high (or "1") logic state or a low (or "0") logic state, and writes the input data bit to the first magnetic tunnel junction 220A as a stored data bit b with the predetermined logic state. Since the reference layers 224B of the magnetic tunnel junctions 220A, 220B have opposite magnetization directions 228A, the MRAM cell 210 writes the input data bit to the second magnetic tunnel junction 220B as a stored data bit /b, which is the complement of the stored data bit b of the first magnetic tunnel junction 220A. Stated somewhat differently, the stored data bit b of the first magnetic tunnel junction 220A and the stored data bit /b of the second magnetic tunnel junction 220B are complementary data bits with opposite logic states. The magnetic tunnel junctions 220A, 220B of the MRAM cell 210 therefore are differentially coupled for read operations because the MRAM cell 210 provides the complementary data bits b, /b with opposite logic states during subsequent read operations.

As desired, the MRAM cell 210 can be provided with two or more of the magnetic tunnel junctions 220A, 220B as illustrated in FIG. 9A. The magnetic tunnel junctions 220A, 220B of FIG. 9A are shown as being disposed in a series arrangement. With the magnetic tunnel junctions 220A, 220B in the series arrangement, the MRAM cell 210 can provide a stored data bit b with the predetermined logic state from each of the magnetic tunnel junctions 220A, 220B during a read operation.

The memory system 100 can include a sense amplifier 500 (shown in FIG. 2), such as a differential sense amplifier and/or a multistage differential sense amplifier, to perform a matching operation for increasing a sensing speed of the MRAM cell 210. Further details regarding selected embodiments of the sense amplifier 500 are discussed in more detail below with reference to FIGS. 10A-C. The MRAM cell 210 likewise can be coupled with a conventional static random access memory (SRAM) cell that is configured to operate as an integrated amplifier, such as an integrated amplifier of the resistance dynamic variation. The integrated amplifier can advantageously applied to a single MRAM cell 210 that is operating in a "dynamic" mode and/or to a pair of the MRAM cells 210 that is operating in a differential mode.

Figure 10A:
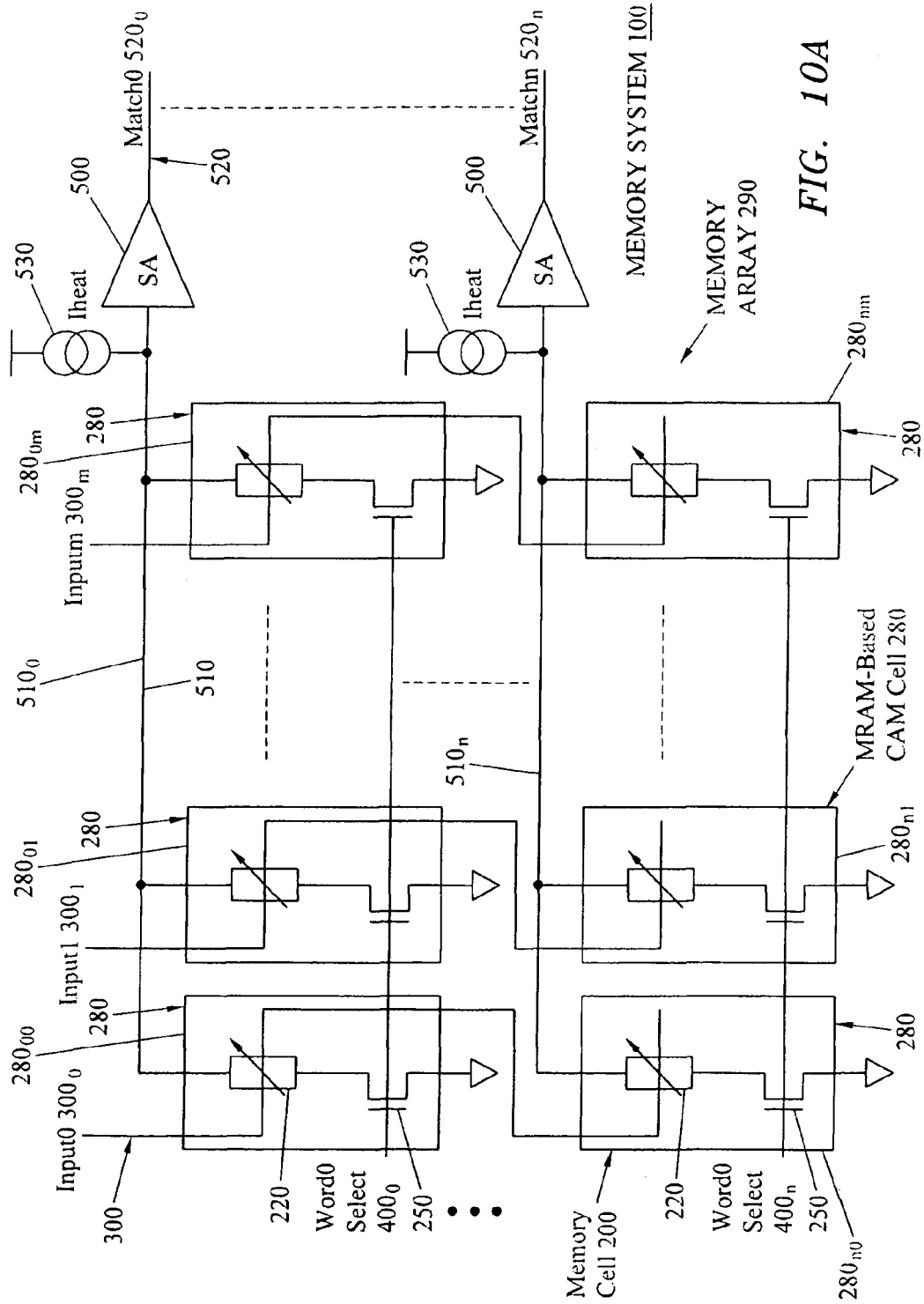
FIG. 10A is a detail drawing illustrating an alternative embodiment of the memory system of FIG. 2, wherein the memory cell comprises a MRAM-based content-addressable memory (CAM) cell that is provided via a single-cell approach.
Figure 10B:
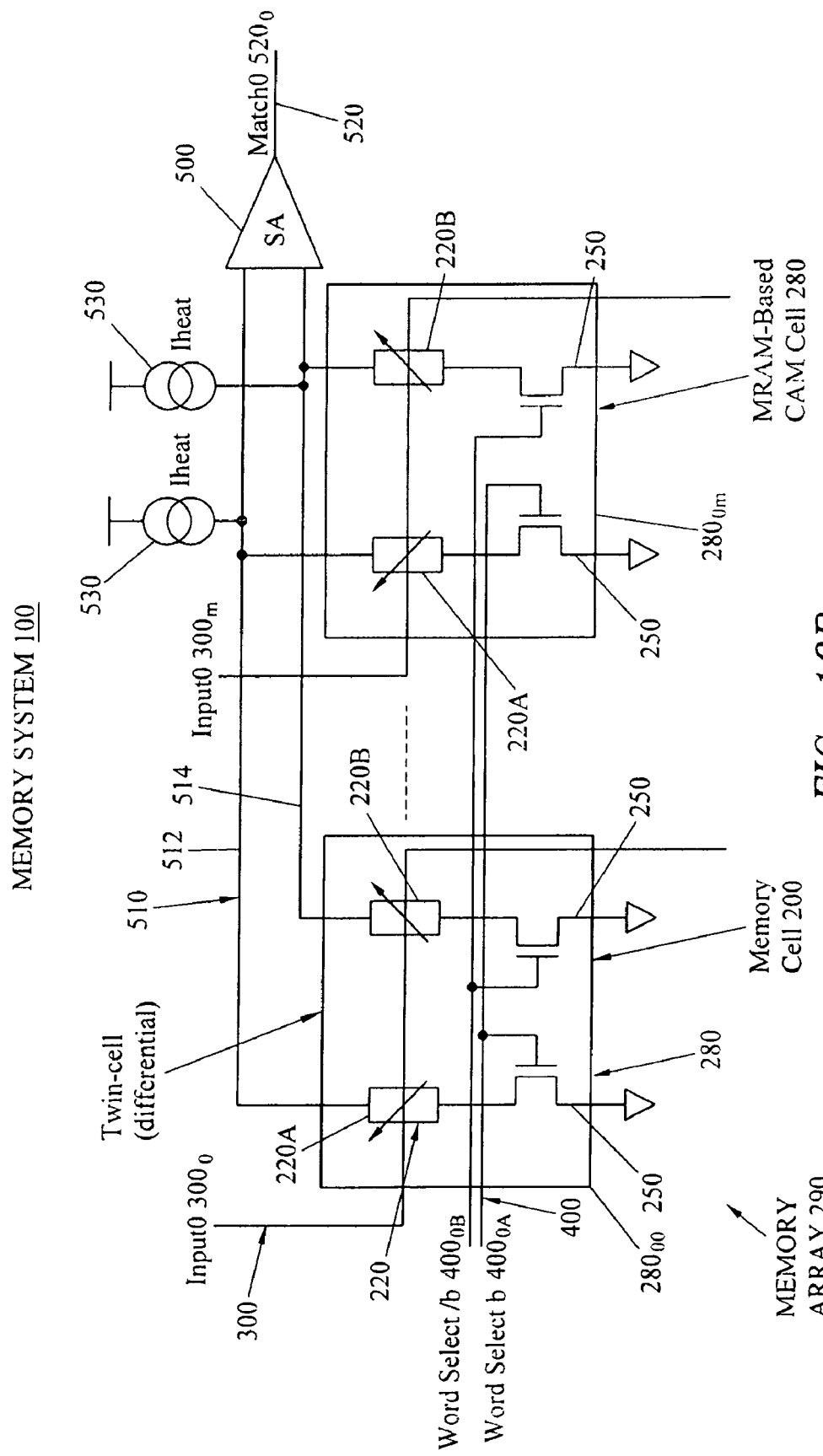
FIG. 10B is a detail drawing illustrating an alternative embodiment of the memory system of FIG. 10A, wherein the MRAM-based CAM cell is provided via a twin-cell approach.
Figure 10C:
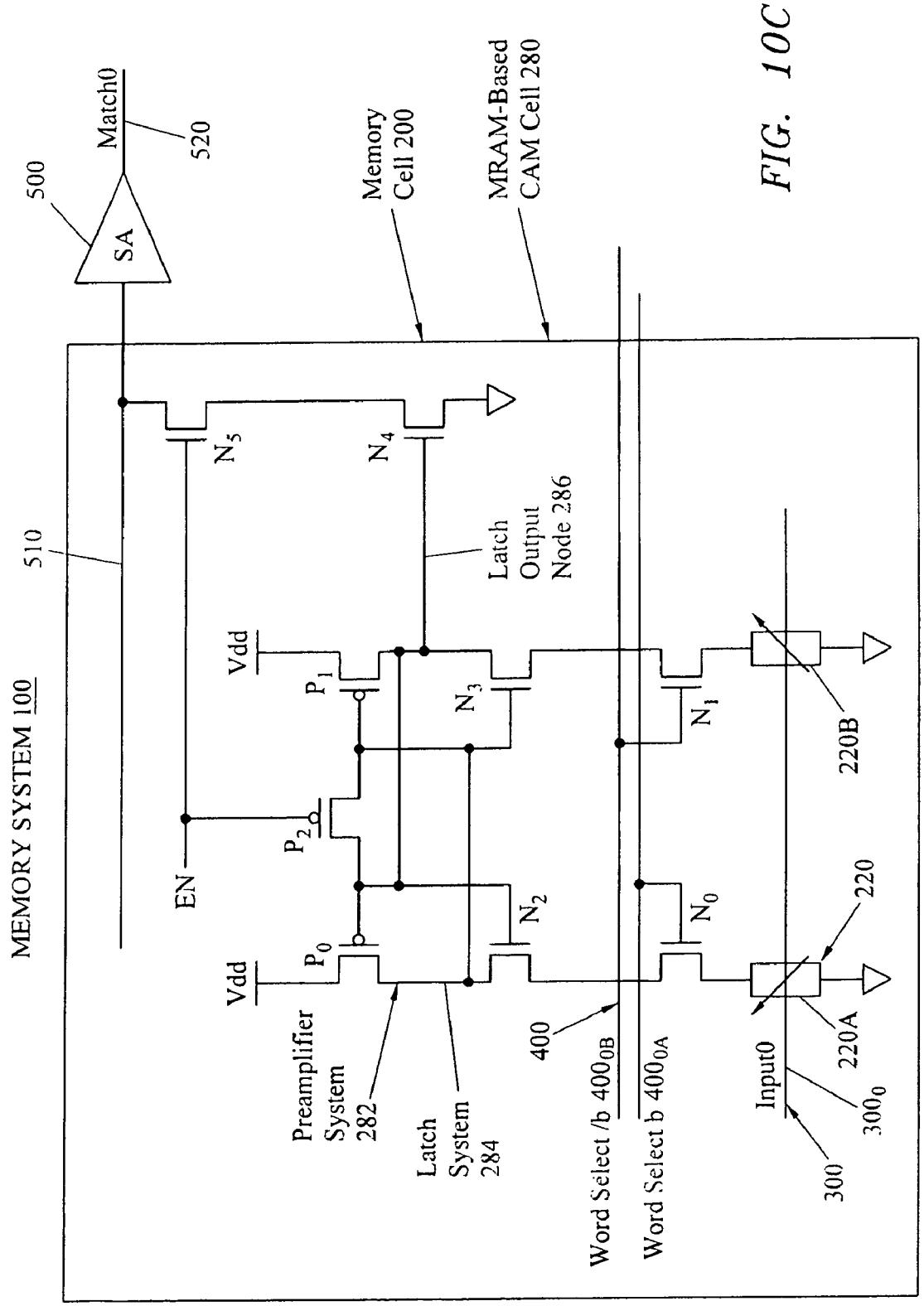
FIG. 10C is a detail drawing illustrating another alternative embodiment of the memory system of FIG. 10A, wherein the MRAM-based CAM cell is provided via a pre-amplifier approach.

The memory system 100 is illustrated in FIGS. 10A-C as comprising a memory array 290 with a plurality of memory cells 200, wherein each memory cell 200 comprises a MRAM-based content-addressable memory (CAM) cell 280. Turning to FIG. 10A, for example, the memory array 290 is shown as being provided as a conventional [N+1]×[M+1] matrix of the MRAM-based CAM cells 280. The number [N+1] thereby represents the number of word select lines $400_0$-$400_N$ and corresponds with the number of rows of the MRAM-based CAM cells 280 in the memory array 290; whereas, the number of input data lines $300_0$-$300_M$ is represented by the number [M+1], which corresponds with the number of columns of the MRAM-based CAM cells 280 in the memory array 290. Depending upon the memory capacity and memory configuration of the memory system 100, the numbers [N+1] and [M+1] each can be any suitable number, as desired.

The MRAM-based CAM cells 280 can be provided via a single-cell approach in the manner discussed in more detail above with reference to the MRAM cell 210 (shown in FIG. 3). In the single-cell approach, each MRAM-based CAM cell 280 can be provided with a magnetic tunnel junction 220 and a selection transistor 250 as shown in FIG. 10A. The magnetic tunnel junction 220 preferably is provided as a multilayered structure in the manner discussed in more detail above with reference to FIG. 3, and includes one or more magnetic MTJ layers 224 (shown in FIG. 3) and/or nonmagnetic MTJ layers 226 (shown in FIG. 3). The MRAM-based CAM cells 280 therefore can be described as one selection transistor 250 and one magnetic tunnel junction 220 (1T/1J) MRAM cells.

As illustrated in FIG. 10A, each MRAM-based CAM cell 280 in a selected column of the memory array 290 shares a common input data line $300_I$. Stated somewhat differently, a selected input data line $300_I$ is coupled with each MRAM-based CAM cell 280 in the relevant column of the memory array 290. For example, the input data line $300_0$ is illustrated as being coupled with the MRAM-based CAM cells $280_{00}, \ldots, 280_{N0}$; whereas, the input data line $300_1$, is coupled with the MRAM-based CAM cells $280_{01}, \ldots, 280_{N1}$. Similarly, each MRAM-based CAM cell 280 in a selected row of the memory array 290 shares a common word select line $400_J$. The common word select line $400_J$ therefore can be coupled with each MRAM-based CAM cell 280 in the relevant row of the memory array 290. The word select line $400_0$ is shown as being coupled with the MRAM-based CAM cells $280_{00}, 280_{01}, \ldots, 280_{0M}$, and the word select line $400_N$ is coupled with the MRAM-based CAM cells $280_{N0}, 280_{N1}, \ldots, 280_{NM}$.

Each MRAM-based CAM cell 280 in a selected row of the memory array 290 likewise is shown as sharing a common match line $510_K$. Thereby, the common match line $510_K$ can be coupled with each MRAM-based CAM cell 280 in the relevant row of the memory array 290. As shown in FIG. 10A, the match line $510_0$ can be coupled with the MRAM-based CAM cells $280_{00}, 280_{01}, \ldots, 280_{0M}$, and the match line $510_0$ N can be coupled with the MRAM-based CAM cells $280_{N0}, 280_{N1}, \ldots, 280_{NM}$. The match lines $510_0, \ldots, 510_N$ are shown as being further coupled with, and configured to provide input signals (not shown) to, a plurality of final sense amplifiers 500. The final sense amplifiers 500 can amplify the input signals to a full logic level and provide output signals (not shown) via output match lines $510_0, \ldots, 520_N$ in a conventional manner.

Upon initiation of an exemplary write operation, an input data word (not shown) is loaded onto an appropriate row of the memory array 290. The input data word comprises a plurality of input data bits each having a plurality of predetermined logic states, such as a high (or "1") logic state or a low (or "0") logic state. The final sense amplifier 500 associated with each relevant match line 510 can be disabled, and the appropriate row of the memory array 290 is selected by applying a voltage (or current) to the associated word select line 400. Each input data bit of the input data word then is written into the appropriate MRAM-based CAM cell 280 via current pulses applied to the input data lines 300. In the manner set forth in more detail above with reference to FIGS. 5A-B, the current pulses induce magnetic fields in the input data lines 300 and thereby switch the storage layers 224A of the respective magnetic tunnel junctions 220 (shown in FIG. 5A), as necessary, to write the data word. The input data word thereby is stored by the memory array 290 as a stored data word.

The logic state of the input data bit written to each MRAM-based CAM cell 280 depends upon the direction by which the associated current pulse flows through the relevant input data line 300. The direction of the associated current pulse, in turn, affects the direction of the magnetic field induced in the relevant input data line 300. The directions of the induced magnetic field likewise affects the magnetic orientation 228A (shown in FIG. 5B) of the relevant respective storage layer 224A of the MRAM-based CAM cell 280, which magnetic orientation 228A determines the logic state of each stored data bit of the stored data word. This write operation is well-known in the art and sometimes is referred to as Field Induced Magnetic Switching (FIMS).

As desired, the memory system 100 can write the input data word to the memory array 290 by applying an exemplary write operation that includes thermally-assisted switching (TAS) in the manner discussed in additional detail above with reference to FIGS. 7A-F. When the write operation with thermally-assisted switching is applied to write the input data word to the memory array 290, the final sense amplifier 500 associated with each relevant match line 510 is disabled, and the appropriate row of the memory array 290 is selected by applying a voltage (or current) to the associated word select line 400. Each match line 510 then is heated via a heating system 530. The heating system 530 can be provided as any conventional type of heating system. For example, the heating system 530 can be provided as a global heating system for heating each match line 510 and/or a plurality of local heating systems, as shown in FIG. 10A, for heating an associated match line 510. Stated somewhat differently, the heating system 530 can comprise a plurality of local heating systems, wherein each row (or column) of CAM cells 280 in the memory array 290 is associated with a local heating system.

Although discussed and shown in terms of thermally-assisted switching for purposes of illustration only, the write operation can be facilitated in any conventional manner, including via application of voltage and/or current to write the input data word to the memory array 290. For example, the memory system 100 can include a global voltage (or current) source system (not shown) for applying voltage (or current) to each match line 510 and/or a plurality of local voltage (or current) source systems (not shown) for applying voltage (or current) to an associated match line 510. The memory system 100 likewise can include a plurality of local voltage (or current) source systems, wherein each row (or column) of CAM cells 280 in the memory array 290 is associated with a local voltage (or current) source system. As desired, the memory system 100 can include the voltage (or current) source system in addition to, and/or as an alternative to, the heating system 530.

Current pulses are applied to the input data lines 300 in the manner discussed above. The current pulses induce magnetic fields in the input data lines 300 and thereby switch the storage layers (or "exchange-bias" layers) 224A of the respective magnetic tunnel junctions 220, as necessary, to write the data word into the appropriate MRAM-based CAM cell 280. As set forth above, the logic state of the input data bit written to each MRAM-based CAM cell 280 depends upon the direction by which the associated current pulse flows through the relevant input data line 300 and, therefore, the direction of the magnetic field induced in the input data line 300. The input data word thereby is stored by the memory array 290 as the stored data word.

Once the input data word is written to, and stored by, the memory array 290, as the stored data word, the memory system, during an exemplary read operation, can provide the stored data word in the manner set forth in more detail above with reference to FIGS. 6A-B. Like the input data word, the stored data word comprises a plurality of stored data bits each having a plurality of predetermined logic states, such as a high (or "1") logic state or a low (or "0") logic state. When the read operation initiated, the final sense amplifier 500 associated with each relevant match line 510 is enabled. A static current then can be applied to each input data line 300. The polarity of the static current preferably comprises an image vector of the desired stored data word. The heating system 530 can be disabled during the read operation or, as desired, can be enabled to operate as a current polarizer for a voltage sensing approach.

Each stored data word in the memory array 290 is globally selected via the word select lines 400. The static currents are provided with appropriate current magnitudes such that the static currents can polarize the reference layers 224B (shown in FIG. 6B) of the respective magnetic tunnel junctions 220 within the memory array 290, preferably without disturbing the corresponding storage layers 224A. Advantageously, global selection of the stored data words enables the stored data words to be sensed in parallel. If the final sense amplifiers 500 comprise current sense amplifiers, for example, the induced current provided to a selected final sense amplifier 500 via the match line 510 can depend upon a sum of the currents of each stored data bit in a corresponding stored data word; whereas, the current flowing through the input data lines 300 can depend upon the relative magnetic orientation between the magnetic orientation 228A (shown in FIG. 6B) of the storage layer 224A and the magnetic orientation 228B (shown in FIG. 6B) of the reference layer 224B.

A matching bit can be defined as having a magnetic orientation equal to the different between the magnetic orientation 228A of the storage layer 224A and the magnetic orientation 228B of the reference layer 224B. The matching bit can be equivalent to a parallel state and, therefore, is associated with a low cell resistance value $R_1$ and a high current value $I_H$. A no-matching bit, in contrast, can be defined as having a magnetic orientation in opposition to the different between the magnetic orientation 228A and the magnetic orientation 228B. Likewise being equivalent to an anti-parallel state, the no-matching bit can be associated with a high cell resistance value $R_2$ and a low current low $I_L$.

A match between the input data word and a stored data word therefore can result in an equivalent input current being providing to the final sense amplifier 500 with an aggregate current magnitude that is equal to the product $[M+1] \times I_H$. Similarly, a non-match between the input data word and a stored data word can result in an equivalent input current with an aggregate current magnitude that is less than or equal to $(M \times I_H) + I_L$. Each final sense amplifier 500 preferably is suitable for sensing currents with an accuracy that is less than the difference $(I_H - I_L)$. Therefore, after a current-to-voltage conversion, the final sense amplifier 500 can provide an appropriate output signal via the relevant output match line 510. The final sense amplifier 500 provides the output signal with a first predetermined logic level, such as a high logic level, if the input data word and the stored data word match; otherwise, the output signal is provided with a second predetermined logic level, such as a low logic level. During matching, the input field current is applied to the relevant input data line 300 without system heating, and the relevant sense amplifier 500 is activated.

Turning to FIG. 10B, the memory system 100 is provided with a memory array 290 comprising a plurality of MRAM-based CAM cells 280, wherein the memory array 290 is provided with a differential MRAM-CAM memory architecture. In the differential MRAM-CAM memory architecture, the MRAM-based CAM cells 280 are provided as magnetic self-referenced twin MRAM cell in the manner set forth in more detail above with reference to FIGS. 9A-C. Each of the MRAM-based CAM cells 280 therefore can be provided with a pair of magnetic tunnel junctions 220, such as first and second magnetic tunnel junctions 220A, 220B, and two selection transistors 250 as shown in FIG. 10B. The magnetic tunnel junctions 220 preferably are provided as multilayered structures in the manner discussed in more detail above with reference to FIG. 3, and include one or more magnetic MTJ layers 224 (shown in FIG. 3) and/or nonmagnetic MTJ layers 226 (shown in FIG. 3). The MRAM-based CAM cells 280 therefore can be described as being two selection transistor 250 and two magnetic tunnel junction 220 (2T/2J) MRAM cells.

Each MRAM-based CAM cell 280 is coupled with a data input line 300, which communicates with the first and second magnetic tunnel junctions 220A, 220B. The first and second magnetic tunnel junctions 220A, 220B likewise are coupled with a pair of match lines 510. The first magnetic tunnel junction 220A is shown as being coupled with a first match line 512; whereas, the second magnetic tunnel junction 220B can be coupled with a second match line 514. As illustrated in FIG. 10B, the match lines 512, 514 can couple the magnetic tunnel junctions 220A, 220B with a differential sense amplifier 500. The differential sense amplifier 500 preferable comprises a multistage differential sense amplifier and is advantageously applied to increase operating speed during matching operations.

An exemplary row of the memory array 290 is illustrated in FIG. 10B with reference to a row of M MRAM-based CAM cells $280_{00}, \ldots, 280_{0M}$. The MRAM-based CAM cells $280_{00}, \ldots, 280_{0M}$ are shown as being respectively coupled with input data lines $300_0$-$300_M$ and selected via word select lines $400_{OA}, 400_{OB}$. As desired, the memory system 100 can include at least one heating system 530 for heating each match line 512, 514 in the manner discussed in more detail above. Although the structure and operation of the memory system 100 is shown and described with reference to one row of MRAM-based CAM cells 280 for purposes of illustration, the memory system 100 can include any suitable number N (shown in FIG. 10A) of rows of MRAM-based CAM cells 280.

Write operations can comprise one or more cycle load operations. When the data input line 260 is provided with a straight geometry, for example, the write operation can include two cycle load operations. Input data is written to the first magnetic tunnel junction 220A of the relevant MRAM-based CAM cells 280 during the first cycle of the load operation; whereas, the input data is written to the second magnetic tunnel junction 220B of the relevant MRAM-based CAM cells 280 during the second cycle. Thereby, the storage layers 224A (shown in FIGS. 9B-C) of the magnetic tunnel junctions 220A, 220B of each MRAM-based CAM cell 280 advantageously can have the same magnetic orientation 228A (shown in FIGS. 9B-C). If the data input line 260 is provided with a U-shaped geometry (shown in FIG. 9A), the write operation can be performed in one cycle load operation, wherein the magnetic tunnel junctions 220A, 220B of the MRAM-based CAM cell 280 have the opposite magnetic orientations 228A. The magnetic tunnel junctions 220A, 220B of each MRAM-based CAM cell 280 advantageously can share the same data input line 300 without adversely affecting the sensing speed of the MRAM-based CAM cells 280.

Returning to the above example wherein the data input line 260 is provided with the straight geometry, current pulses are applied to the input data lines $300_0$-$300_M$ during the first cycle of the two-cycle load operation to induce magnetic fields in the input data lines $300_0$-$300_M$, and the first word select line $400_{OA}$ is activated each in the manner discussed above. Activation of the first word select line $400_{OA}$ enables the input data associated with the current pulses on the input data lines $300_0$-$300_M$ to be written to the first magnetic tunnel junction 220A of the relevant MRAM-based CAM cells 280. As desired, the heating system 530 likewise can be activated to heat the first match line 512, which is associated with the enabled first magnetic tunnel junctions 220A. Data thereby can be written to the first magnetic tunnel junction 220A of the MRAM-based CAM cells 280 during the first cycle of the load operation.

Current pulses likewise are applied to the input data lines $300_0$-$300_M$ during the second cycle of the two-cycle load operation. Magnetic fields thereby are induced in the input data lines $300_0$-$300_M$ as discussed above. Here, the second word select line $400_{OB}$ is activated, enabling the input data associated with the current pulses on the input data lines $300_0$-$300_M$ to be written to the second magnetic tunnel junction 220B of the relevant MRAM-based CAM cells 280. The heating system 530 can be activated, as desired. The second match line 512, which is associated with the enabled second magnetic tunnel junctions 220A, thereby can be heated in the manner discussed above. Data thereby can be written to the second magnetic tunnel junction 220B of the MRAM-based CAM cells 280 during the second cycle of the load operation.

The two-cycle load operation can be followed by a matching operation. During the matching operation, the first and second word select lines $400_{OA}, 400_{OB}$ are activated. The reference layers 224B (shown in FIGS. 9B-C) of the magnetic tunnel junctions 220A, 220B of each MRAM-based CAM cell 280 thereby can have the same magnetization directions 228B (shown in FIGS. 9B-C). If the storage layer 224A and the reference layer 224B of a selected magnetic tunnel junction 220A, 220B have respective magnetic orientations 228A, 228B in opposing directions (or are "antiparallel"), the selected magnetic tunnel junction 220A, 220B can have a high cell resistance value $R_2$ (shown in FIG. 4B), and the associated match line 512, 514 can have a low line current in the manner set forth in more detail above. Similarly, the selected magnetic tunnel junction 220A, 220B can have a low cell resistance value $R_1$ (shown in FIG. 4B) such that the associated match line 512, 514 has a high line current if the storage layer 224A and the reference layer 224B of the selected magnetic tunnel junction 220A, 220B have respective magnetic orientations 228A, 228B in the same direction (or are "parallel"). The differential sense amplifier 500 can receive the line currents provided by the respective match lines 512, 514 and can provide the result of a comparison of the line currents via an output match line 510.

The memory system 100 likewise can be provided in a pre-amplifier approach as illustrated in FIG. 10C. In the pre-amplifier approach, each MRAM-based CAM cell 280 is provided as magnetic self-referenced twin MRAM cell in the manner set forth in more detail above with reference to FIGS. 9A-C. The MRAM-based CAM cells 280 therefore can be provided with a pair of magnetic tunnel junctions 220, such as first and second magnetic tunnel junctions 220A, 220B as shown in FIG. 10B. The magnetic tunnel junctions 220 preferably are provided as multilayered structures in the manner discussed in more detail above with reference to FIG. 3, and include one or more magnetic MTJ layers 224 (shown in FIG. 3) and/or nonmagnetic MTJ layers 226 (shown in FIG. 3). The MRAM-based CAM cells 280 preferably is provided as a two selection transistor 250 (shown in FIG. 10B) and two magnetic tunnel junction 220 (2T/2J) MRAM cell as discussed above.

The exemplary MRAM-based CAM cell 280 as shown in FIG. 10C further includes a local pre-amplifier system 282. The local pre-amplifier system 282 can be provided in any conventional manner and preferably is provided as a local sense amplifier system. For example, the local pre-amplifier system 282 of FIG. 10C is illustrated as comprising a latch-based local pre-amplifier system 282. The MRAM-based CAM cell 280 can be coupled with a data input line 300, which communicates with the first and second magnetic tunnel junctions 220A, 220B, and can be selected via word select lines $400_{OA}$, $400_{OB}$. The magnetic tunnel junctions 220A, 220B can communicate with at least one match line 510 via the local pre-amplifier system 282. As desired, the memory system 100 can include at least one heating system 530 (shown in FIG. 10B) for heating each match line 510 in the manner discussed in more detail above. Although the structure and operation of the memory system 100 is shown and described with reference to one MRAM-based CAM cell 280 for purposes of illustration, the memory system 100 can include any suitable number and/or configuration of MRAM-based CAM cells 280.

In the manner set forth above with reference to the differential MRAM-CAM memory architecture (shown in FIG. 10B), write operations for the MRAM-based CAM cells 280 in the pre-amplifier approach can comprise one or more cycle load operations. When the data input line 260 is provided with a U-shaped geometry (shown in FIG. 9A), for example, the write operation can be performed in one cycle load operation, wherein the magnetic tunnel junctions 220A, 220B of the MRAM-based CAM cell 280 have the opposite magnetic orientations 228A. Alternatively, or in addition, if the data input line 260 is provided with a straight geometry, for example, the write operation can include two cycle load operations, and the storage layers 224A (shown in FIGS. 9B-C) of the magnetic tunnel junctions 220A, 220B of each MRAM-based CAM cell 280 advantageously can have the same magnetic orientation 228A (shown in FIGS. 9B-C).

For two-cycle load operations, input data is written to the first magnetic tunnel junction 220A of the MRAM-based CAM cell 280 during the first cycle of the load operation; whereas, the input data is written to the second magnetic tunnel junction 220B of the relevant MRAM-based CAM cell 280 during the second cycle. As shown in FIG. 1C, the first word select line $400_{OA}$ can be coupled with the first magnetic tunnel junction 220A via a first switching transistor, such an N-channel metal-oxide semiconductor field effect transistor (or N-channel MOSFET) $N_0$. The second word select line $400_{OB}$ and the second magnetic tunnel junction 220B similarly can be coupled via a second switching transistor, such N-channel MOSFET $N_1$.

During the first cycle of the two-cycle load operation, current pulses are applied to the input data line 300 to induce magnetic fields in the input data line 300, and the first word select line $400_{OA}$ is activated each in the manner discussed above. Activation of the first word select line $400_{OA}$ enables an input data bit associated with the current pulses on the input data line 300 to be written to the first magnetic tunnel junction 220A of the MRAM-based CAM cell 280. The input data bit thereby can be written to the first magnetic tunnel junction 220A during the first cycle of the load operation. Current pulses likewise are applied to the input data line 300 during the second cycle of the load operation. Magnetic fields thereby are induced in the input data line 300 as discussed above. Here, the second word select line $400_{OB}$ is activated, enabling the input data bit associated with the current pulses on the input data line 300 to be written to the second magnetic tunnel junction 220B of the MRAM-based CAM cell 280. The input data bit thereby can be written to the second magnetic tunnel junction 220B during the second cycle of the load operation.

Illustrated as being provided in a conventional push-pull configuration, the local pre-amplifier system 282 can include a first pair of cross-coupled P-channel metal-oxide semiconductor field effect transistors (or P-channel MOSFETs) $P_0$, $P_1$ and a second pair of cross-coupled N-channel MOSFETs $N_2$, $N_3$. The configuration of the first pair of cross-coupled P-channel MOSFETs $P_0$, $P_1$ and the second pair of cross-coupled N-channel MOSFETs $N_2$, $N_3$ form a conventional latch system 284. One of the current-carrying electrodes, such as a source electrode and/or a drain electrode, of each of the P-channel MOSFETs $P_0$, $P_1$ is coupled with a voltage source (not shown) such that a voltage potential $V_{dd}$ associated with a high (or "1") logic state is applied to the current-carrying electrodes. The base electrodes of the MOSFETs $P_0$, $P_1$, $N_2$, $N_3$ further are shown as being coupled via a P-channel MOSFET $P_2$, which has a base electrode coupled with an enable signal EN. The enable signal EN likewise can be coupled with a base electrode of an N-channel MOSFET $N_5$. The N-channel MOSFET $N_5$ is disposed between the match line 510 and another N-channel MOSFET $N_4$, which provides a source-drain path to ground.

The magnetic tunnel junctions 220A, 220B of the MRAM-based CAM cell 280 preferably are isolated from the match line 510 during the loading cycles. As desired, the magnetic tunnel junctions 220A, 220B likewise can be isolated from the match line 510 when the MRAM-based CAM cell 280 is in a standby mode and/or when the word select lines $400_{OA}$, $400_{OB}$ each have a low (or "0") logic state. The magnetic tunnel junctions 220A, 220B and the match line 510 can be isolated in any conventional manner. As shown in FIG. 10C, for example, the magnetic tunnel junctions 220A, 220B are isolated from the match line 510 via the N-channel MOSFET $N_5$. The N-channel MOSFET $N_5$ can be configured to isolate the magnetic tunnel junctions 220A, 220B from the match line 510 by providing and/or maintaining the high logic state at the enable signal EN.

The two-cycle load operation can be followed by a sensing operation. When the sensing operation has been initiated, the match line 510 is precharged to the high logic state, and the enable signal EN assumes the high logic state. The first and second word select lines $400_{OA}$, $400_{OB}$ are activated, and input data bit is applied to the data input line 300 as pulses of a static current, inducing a magnetic field in the data input line 300, each as set forth above. The latch system 284 formed by the P-channel MOSFETs $P_0$, $P_1$ and the N-channel MOSFETs $N_2$, $N_3$ thereby becomes unbalanced, enabling the local pre-amplifier system 282 to sense the differential magnetic state of the magnetic tunnel junctions 220A, 220B. Thereby, if the magnetic tunnel junction 220B stores a data bit b with a low logic state, the match line 510 remains at the precharged logic state; whereas, the potential on the match line 510 drops to the low logic state if the stored data bit b has a high logic state.

If the storage layer 224A (shown in FIGS. 9B-C) and the reference layer 224B (shown in FIGS. 9B-C) of a selected magnetic tunnel junction 220A, 220B have respective magnetic orientations 228A, 228B (shown in FIGS. 9B-C) in opposing directions (or are "antiparallel"), the magnetic tunnel junction 220A, 220B can have a high cell resistance value $R_2$ (shown in FIG. 4B) in the manner set forth in more detail above. Similarly, the magnetic tunnel junction 220A, 220B can have a low cell resistance value $R_1$ (shown in FIG. 4B) if the storage layer 224A and the reference layer 224B of the magnetic tunnel junction 220A, 220B have respective magnetic orientations 228A, 228B in the same direction (or are "parallel"). A mismatch between the magnetic tunnel junctions 220A, 220B of the MRAM-based CAM cell 280 thereby drive the latch output node 286 of the latch system 284 to the high logic state.

Therefore, when the first magnetic tunnel junction 220A and the second magnetic tunnel junctions 220B of the MRAM-based CAM cell 280 do not match, the latch output node 286 of the latch system 284 assumes the high logic state and enables the N-channel MOSFET $N_4$. The N-channel MOSFET $N_4$, in turn, drives the match line 510 to a low (or "0") logic state. Similarly, the latch output node 286 of the latch system 284 assumes the low logic state if a match occurs between the magnetic tunnel junctions 220A, 220B of the MRAM-based CAM cell 280. The latch output node 286 of the latch system 284 provides the low logic state, disabling the N-channel MOSFET $N_4$. The match line 510 thereby is not driven to the low logic state and is permitted to maintain the previous logic state. The logic state of the match line 510 is provided to the sense amplifier 500, which can provide an appropriate output signal via the relevant output match line 510.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

What is claimed is:

1. A method for writing data to a content addressable memory (CAM) memory cell including a switching transistor coupled with a multilayer magnetic tunnel junction formed from an insulating layer being disposed between first and second magnetic layers, said first magnetic layer being in communication with a first line and having a magnetization with a first magnetization direction, said second magnetic layer being in communication with a second line and having a magnetization with a second magnetization direction, said first and second magnetization direction being switchable by passing at least a portion of a current in said first and/or second line, said method comprising:

heating a selected magnetic layer of the magnetic tunnel junction to a predetermined high temperature threshold by applying said current to the magnetic tunnel junction; and switching the magnetization direction of said selected magnetic layer by passing at least a portion of said current via at least one of the first line and the second line.

2. The method of claim 1, wherein said heating the selected magnetic layer of the magnetic tunnel junction comprises heating the first layer of the magnetic tunnel junction.

3. The method of claim 1, wherein said at least a portion of said current comprises a field current that generates a magnetic field for switching the magnetization of said selected magnetic layer.

4. The method of claim 1, wherein said at least a portion of said current comprises a spin polarized write current for inducing magnetic switching of said selected magnetic layer.

5. A method of writing data to a content-addressable memory (CAM) memory cell including a switching transistor coupled with a multilayer magnetic tunnel junction formed from an insulating layer being disposed between first and second magnetic layers, said first magnetic layer being in communication with a first line and having a magnetization with a first magnetization direction, said second magnetic layer being in communication with a second line and having a magnetization with a second magnetization direction, said first and second magnetization directions being adapted to be aligned by passing a current pulse in said first and/or second line, said method comprising:

providing write data to said first magnetic layer as said current pulse via the first line, the current pulse inducing a magnetic field in the first line;

activating said switching transistor and applying at least a portion of the current pulse to said magnetic tunnel junction via said switching transistor;

heating said magnetic tunnel junction to a predetermined high temperature threshold by applying at least a portion of the current pulse to said magnetic tunnel junction via said switching transistor;

deselecting said switching transistor once said magnetic tunnel junction reaches said predetermined high temperature threshold;

maintaining the induced magnetic field until said magnetic tunnel junction reaches a predetermined low temperature threshold; and aligning said first magnetization direction of said first magnetic layer in accordance with the induced magnetic field such that the write data is written to said memory cell.

6. The method of claim 5, further comprising sensing the data written to said memory cell by:

providing input data to said second magnetic layer as a second current pulse via the second line, the second current pulse inducing a magnetic field in the second line;

aligning said second magnetization direction of said second magnetic layer in accordance with the magnetic field induced in the second line; and comparing the input data with the write data by measuring a resistance value of said magnetic tunnel junction.

7. The method of claim 6, wherein said comparing the input data with the write data includes comparing said second magnetization direction of said second magnetic layer with said first magnetization direction of said first magnetic layer.

8. The method of claim 7, wherein said comparing the input data with the write data comprises measuring a variation of said resistance value of said magnetic tunnel junction.

9. A method of writing data to a content-addressable memory (CAM) memory cell including a switching transistor coupled with a multilayer magnetic tunnel junction formed from an insulating layer being disposed between first and second magnetic layers, said first magnetic layer being in communication with a first line and having a magnetization with a first magnetization direction, said second magnetic layer being in communication with a second line and having a magnetization with a second magnetization direction, said method comprising:
- providing write data to said first magnetic layer as a current pulse via the first line, the current pulse having a predetermined amplitude and being spin polarized;
- activating said switching transistor and applying at least a portion of the current pulse to said magnetic tunnel junction via said switching transistor;
- heating said magnetic tunnel junction to a predetermined high temperature threshold by applying at least a portion of the current pulse to said magnetic tunnel junction via said switching transistor;
- applying the spin-polarized current pulse to said first magnetic layer to induce a local spin torque on said first magnetic layer;
- deselecting said switching transistor once said magnetic tunnel junction reaches said predetermined high temperature threshold; and
- progressively reducing the amplitude of the current pulse as said magnetic tunnel junction cools to a predetermined low temperature threshold,
- wherein said first magnetization direction of said first magnetic layer is aligned in accordance with the induced local spin torque such that the write data is written to said memory cell.

10. The method of claim 9, further comprising sensing the data written to said memory cell by:
- providing input data to said second magnetic layer as a second current pulse via the second line, the second current pulse being spin polarized;
- applying the second spin-polarized current pulse to said second magnetic layer to induce a local spin torque on said second magnetic layer;
- aligning said second magnetization direction of said second magnetic layer in accordance with the local spin torque induced by the second current pulse; and
- comparing the input data with the write data by measuring a resistance value of said magnetic tunnel junction.

11. The method of claim 10, wherein said comparing the input data with the write data includes comparing said second magnetization direction of said second magnetic layer with said first magnetization direction of said first magnetic layer.

12. The method of claim 11, wherein said comparing the input data with the write data comprises measuring a variation of said resistance value of said magnetic tunnel junction.

13. A content-addressable memory (CAM) memory cell, comprising:
- a switching transistor; and
- a multilayer magnetic tunnel junction in communication with said switching transistor and formed from an insulating layer being disposed between first and second magnetic layers, said first magnetic layer being in communication with a first line and having a magnetization with a first magnetization direction, said second magnetic layer being in communication with a second line and having a magnetization with a second magnetization direction, said magnetic tunnel junction having a resistance value,
- wherein, during a write operation, write data is provided to said first magnetic layer as a current pulse via the first line, the current pulse having a predetermined amplitude and being spin polarized, said magnetic tunnel junction being heated to a predetermined high temperature threshold by activating said switching transistor to apply at least a portion of the current pulse to said magnetic tunnel junction via said switching transistor, the spin-polarized current pulse being applied to said first magnetic layer to induce a local spin torque on said first magnetic layer, said switching transistor being deactivated once said magnetic tunnel junction reaches said predetermined high temperature threshold, the amplitude of the current pulse being progressively reduced as said magnetic tunnel junction cools to a predetermined low temperature threshold,
- wherein said first magnetization direction of said first magnetic layer is aligned in accordance with the induced local spin torque such that the write data is written to said memory cell.

14. The CAM memory cell of claim 13, wherein, during a sense operation, input data is provided to said second magnetic layer as a second current pulse via the second line, the second current pulse being spin polarized;
- the second spin-polarized current pulse is applied to said second magnetic layer to induce a local spin torque on said second magnetic layer;
- said second magnetization direction of said second magnetic layer is aligned in accordance with the local spin torque induced by the second current pulse; and
- the input data with the write data are compared by measuring a resistance value of said magnetic tunnel junction.

15. The CAM memory cell of claim 14, wherein said second magnetization direction of said second magnetic layer is compared with said first magnetization direction of said first magnetic layer.

16. The CAM memory cell of claim 15, wherein the input data with the write data are compared by measuring a variation of said resistance value of said magnetic tunnel junction.

* * * * *

UNITED STATES PATENT AND TRADEMARK OFFICE
CERTIFICATE OF CORRECTION

| | | |
|---|---|---|
| PATENT NO. | : 7,894,228 B2 | Page 1 of 1 |
| APPLICATION NO. | : 12/422752 | |
| DATED | : February 22, 2011 | |
| INVENTOR(S) | : Jean-Pierre Nozieres et al. | |

It is certified that error appears in the above-identified patent and that said Letters Patent is hereby corrected as shown below:

In the Specification:

Column 12, line 59-60 - delete "$510_oN$" and replace with --$510_o$--

Column 17, line 65 - delete "1C" and replace with --10C--

Signed and Sealed this
Twenty-fourth Day of May, 2011

David J. Kappos
*Director of the United States Patent and Trademark Office*